(12) United States Patent
Park et al.

(10) Patent No.: US 12,501,785 B2
(45) Date of Patent: Dec. 16, 2025

(54) DISPLAY DEVICE

(71) Applicant: Samsung Display Co., LTD., Yongin-si (KR)

(72) Inventors: Byung-Kyu Park, Yongin-si (KR); Jongoh Kim, Yongin-si (KR); Hyungab Bang, Yongin-si (KR); Hojun Lee, Yongin-si (KR); Hoyoung Kim, Yongin-si (KR); Hyung-Ho Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 358 days.

(21) Appl. No.: 18/341,668

(22) Filed: Jun. 26, 2023

(65) Prior Publication Data

US 2024/0057395 A1 Feb. 15, 2024

(30) Foreign Application Priority Data

Aug. 9, 2022 (KR) .................. 10-2022-0099210

(51) Int. Cl.
*H10K 59/122* (2023.01)
*H10K 59/127* (2023.01)
*H10K 59/38* (2023.01)

(52) U.S. Cl.
CPC ......... *H10K 59/122* (2023.02); *H10K 59/127* (2023.02); *H10K 59/38* (2023.02)

(58) Field of Classification Search
CPC ..... H10K 59/127; H10K 59/38; H10K 59/122
USPC ................................................ 313/498–512
See application file for complete search history.

(56) References Cited

U.S. PATENT DOCUMENTS

| 2016/0268354 | A1 | 9/2016 | Xiong et al. |
| 2019/0025634 | A1* | 1/2019 | Park ................. G02F 1/133377 |
| 2021/0151528 | A1 | 5/2021 | Nan et al. |
| 2021/0351238 | A1* | 11/2021 | Park ..................... H10K 59/878 |
| 2022/0223666 | A1 | 7/2022 | Kim et al. |
| 2022/0246684 | A1 | 8/2022 | Kim et al. |

(Continued)

FOREIGN PATENT DOCUMENTS

| KR | 10-2020-0027600 A | 3/2020 |
| KR | 10-2021-0147158 A | 12/2021 |

(Continued)

*Primary Examiner* — Christopher M Raabe
(74) *Attorney, Agent, or Firm* — Womble Bond Dickinson (US) LLP

(57) ABSTRACT

A display device includes: a first substrate including first, second, and third light emitting areas, first, second, and third pixel electrodes respectively in the first, second, and third light emitting areas on the first substrate, a pixel defining layer in the non-light emitting area on the first substrate and defining a peripheral opening partially overlapping the non-light emitting area, a second substrate including first, second, and third light transmitting areas and a light blocking area surrounding the first, second, and third light transmitting areas, a bank layer in the light blocking area on one surface of the second substrate, defining a first opening overlapping each of the first, second, and third light transmitting areas, and defining second openings overlapping the light blocking area wherein each of the second openings has a polygonal planar shape, and a color conversion layer in the first opening and including color conversion particles.

24 Claims, 20 Drawing Sheets

(56) References Cited

U.S. PATENT DOCUMENTS

| | | | |
|---|---|---|---|
| 2022/0246704 A1 | 8/2022 | Yang et al. | |
| 2022/0359798 A1* | 11/2022 | Kim | H10H 29/142 |
| 2024/0170621 A1* | 5/2024 | Kim | H10H 20/8513 |
| 2024/0172515 A1* | 5/2024 | Kim | H10K 59/38 |
| 2024/0244934 A1* | 7/2024 | Park | H10K 59/35 |
| 2024/0357913 A1* | 10/2024 | Kim | H10K 59/8792 |
| 2025/0221227 A1* | 7/2025 | Kim | H10K 59/122 |
| 2025/0248284 A1* | 7/2025 | Yang | H10K 59/1201 |

FOREIGN PATENT DOCUMENTS

| | | | |
|---|---|---|---|
| KR | 10-2022-0100761 A | 7/2022 | |
| KR | 10-2022-0105253 A | 7/2022 | |
| KR | 10-2022-0110409 A | 8/2022 | |

* cited by examiner

DISPLAY DEVICE

CROSS-REFERENCE TO RELATED APPLICATION

The present application claims priority to and the benefit of Korean Patent Application No. 10-2022-0099210, filed on Aug. 9, 2022, the entire content of which is incorporated herein by reference.

BACKGROUND

1. Field

Aspects of some embodiments relate generally to a display device.

2. Description of the Related Art

Due to characteristics such as light weight and thinness of flat panel displays, flat panel displays are being used as display devices in various applications and are replacing a cathode ray display devices. Representative examples of such flat panel display devices include a liquid crystal device ("LCD") and an organic light emitting display device ("OLED").

Recently, organic light emitting display devices including an organic light emitting element including an organic material and a color conversion layer including color conversion particles have been studied. The color conversion layer may convert a wavelength of light provided from the organic light emitting element. Accordingly, the color conversion layer may emit light having a color different from that of incident light.

The above information disclosed in this Background section is only for enhancement of understanding of the background and therefore the information discussed in this Background section does not necessarily constitute prior art.

SUMMARY

Aspects of some embodiments relate generally to a display device. For example, aspects of some embodiments include a display device that is capable of displaying visual information.

Aspects of some embodiments include a display device with relatively reduced defects.

A display device according to some embodiments of the present invention may include a first substrate including first, second, and third light emitting areas and a non-light emitting area surrounding the first, second, and third light emitting areas, first, second, and third pixel electrodes respectively in the first, second, and third light emitting areas on the first substrate, a pixel defining layer in the non-light emitting area on the first substrate and defining a peripheral opening partially overlapping the non-light emitting area, a second substrate including first, second, and third light transmitting areas and a light blocking area surrounding the first, second, and third light transmitting areas, a bank layer in the light blocking area on one surface of the second substrate facing the pixel defining layer, defining a first opening overlapping each of the first, second, and third light transmitting areas, and defining second openings overlapping the light blocking area wherein each of the second openings has a polygonal planar shape, and a color conversion layer in the first opening and including color conversion particles.

According to some embodiments, the display device may further include a planarization layer between the first substrate and the pixel defining layer, and including an organic material. The peripheral opening may expose a portion of an upper surface of the planarization layer.

According to some embodiments, the pixel defining layer may continuously extend along at least two adjacent light emitting areas among the first, second, and third light emitting areas.

According to some embodiments, each of the first, second, and third light emitting areas may be repeatedly arranged along a first direction and a second direction crossing the first direction. According to some embodiments, the pixel defining layer may include: a first pattern portion covering an edge of the first pixel electrode, a second pattern portion covering an edge of the second pixel electrode, a third pattern portion covering an edge of the third pixel electrode, a first connection portion overlapping a portion of the first pixel electrode and connecting the first, second, and third pattern portions, and second connection portions connecting two adjacent pattern portions among the first, second, and third pattern portions and including a portion extending in the first direction and a portion extending in the second direction.

According to some embodiments, a central opening exposing a portion of an upper surface of each of the first, second, and third pixel electrodes may be further defined in the pixel defining layer.

According to some embodiments, the pixel defining layer may include an inorganic material or an organic material.

According to some embodiments, the pixel defining layer may include an organic material containing at least one selected from a group consisting of black pigment, black dye, and carbon black.

According to some embodiments, each of the second openings may have a rectangular planar shape.

According to some embodiments, the bank layer may include a first partition wall in at least one of the second openings or a second partition wall formed integrally with first partition wall and being a remaining portion except for the first partition wall.

According to some embodiments, the second opening in which the first partition wall is located may be divided into two openings by the first partition wall.

According to some embodiments, a third opening extending in a first direction and a fourth opening extending in a second direction crossing the first direction may be further defined in the bank layer.

According to some embodiments, each of the first, second, and third light emitting areas may be repeatedly arranged along a first direction and a second direction crossing the first direction. According to some embodiments, the third opening may be positioned adjacent to the first opening overlapping the second light transmitting area, and the fourth opening is positioned between the first openings overlapping the first and third light transmitting areas, respectively.

According to some embodiments, the first light transmitting area may overlap the first light emitting area, the second light transmitting area may overlap the second light emitting area, and the third light transmitting area may overlap the third light emitting area.

According to some embodiments, an area of the first light emitting area may be smaller than an area of the first light transmitting area, an area of the second light emitting area may be smaller than an area of the second light transmitting area, and an area of the third light emitting area may be smaller than an area of the third light transmitting area.

According to some embodiments, the first, second, and third emitting areas may emit light of a first color. According to some embodiments, light of a second color different from the first color may be transmitted through the first light transmitting area, light of a third color different from the first color and the second color may be transmitted through the second light transmitting area, and light of the first color may be transmitted through the third light transmitting area.

According to some embodiments, the display device may further include a color filter layer on one surface of the second substrate and a protective layer on one surface of the color filter layer facing the bank layer and including an inorganic material.

According to some embodiments, the bank layer may be on one surface of the protective layer facing the bank layer, and the second opening exposes an upper surface of the protective layer.

According to some embodiments, the display device may further include a filling layer between the pixel defining layer and the bank layer, and including a light transmitting material. According to some embodiments, a portion of the filling layer may be filled in the second opening.

A display device according to some embodiments of the present invention may include a first substrate including a light emitting area, a contact area adjacent to the light emitting area, and a non-light emitting area surrounding the light emitting area and the contact area, a pixel electrode in the light emitting area on the first substrate, a pixel defining layer on the first substrate and defining a central opening exposing a portion of an upper surface of the pixel electrode in the light emitting area and a peripheral opening spaced apart from the pixel electrode in a plan view in the non-light emitting area, a second substrate including a light transmitting area and a light blocking area surrounding the light transmitting area and overlapping the contact area, a bank layer on one surface of the second substrate facing the pixel defining layer, defining a first opening overlapping the light transmitting area, and defining second openings overlapping the contact area wherein each of the second openings has a polygonal planar shape, and a color conversion layer in the first opening and including color conversion particles.

According to some embodiments, a laser drilling process may be performed on the contact area.

According to some embodiments, the display device may further include an insulating pattern on the first substrate, adjacent to contact area, and including a same material as the pixel defining layer.

According to some embodiments, the insulating pattern may be spaced apart from the pixel defining layer in a plan view.

According to some embodiments, an entire portion of the insulating pattern may overlap the second opening.

According to some embodiments, the insulating pattern may be spaced apart from the bank layer in a plan view.

A display device according to some embodiments of the present invention may include an array substrate and a color conversion substrate on the array substrate. According to some embodiments, the array substrate may include a pixel defining layer in which a peripheral opening partially overlapping a non-light emitting area is defined. According to some embodiments, the color conversion substrate may include a bank layer in which a second opening overlapping a light blocking area and having a polygonal planar shape.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
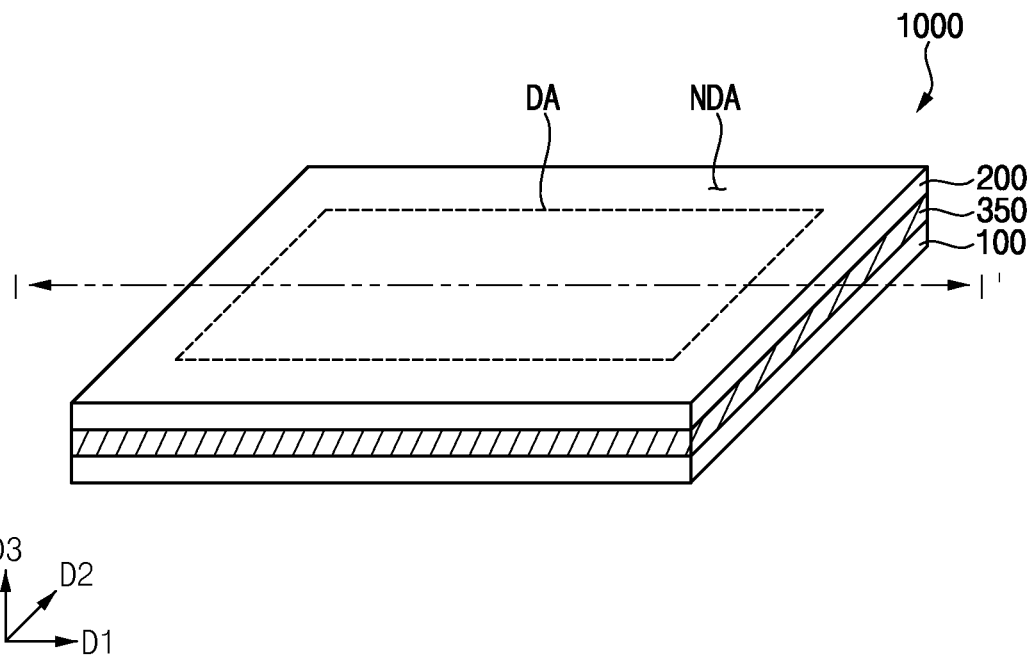
FIG. 1 is a perspective view illustrating a display device according to some embodiments.

Hereinafter, a display device according to some embodiments of the present disclosure will be explained in more detail with reference to the accompanying drawings. The same reference numerals are used for the same components in the drawings, and redundant descriptions of the same components will be omitted.

Figure 2:
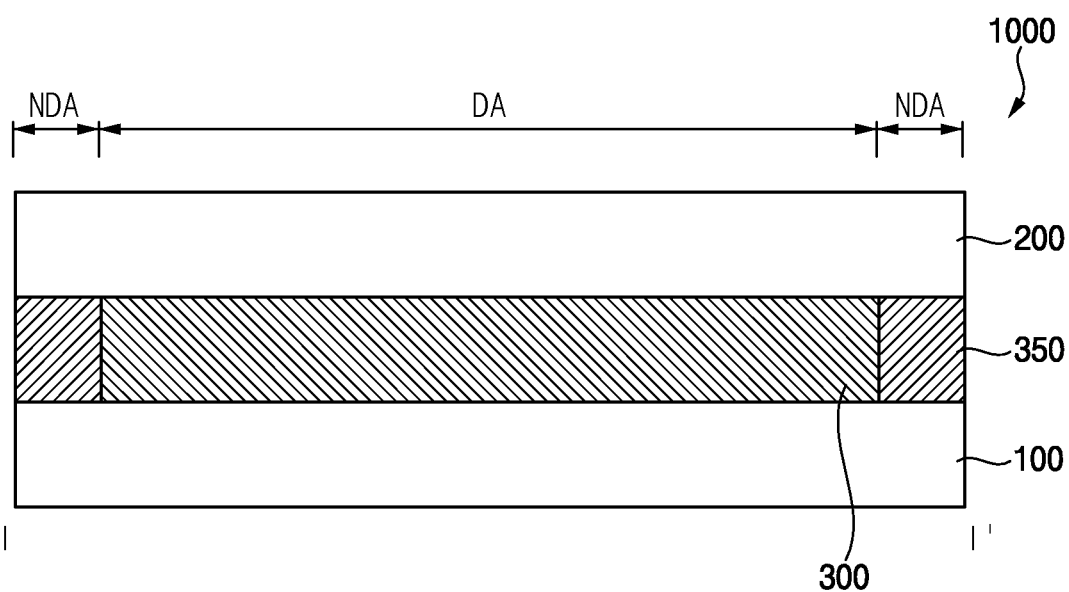
FIG. 2 is a cross-sectional view taken along the line I-I' of FIG. 1 according to some embodiments.

FIG. 1 is a perspective view illustrating a display device according to some embodiments. FIG. 2 is a cross-sectional view taken along the line I-I' of FIG. 1.

Referring to FIGS. 1 and 2, a display device 1000 according to some embodiments of the present invention may include an array substrate 100, a sealing portion 350, a filling layer 300, and a color conversion substrate 200.

The display device 1000 may have a rectangular shape in a plan view (e.g., in a view perpendicular or normal with respect to a plane of the display surface of the display device 1000). For example, the display device 1000 may include two first sides extending in a first direction D1 and two second sides extending in a second direction D2. A corner where the first side and the second side meet may be a right angle. However, embodiments according to the present invention are not limited thereto, and a corner where the first side and the second side of the display device 1000 meet may form a curved surface.

The display device 1000 may include a display area DA and a non-display area NDA. The display area DA may display images by generating light or adjusting transmittance of light provided from an external light source. The non-display area NDA may not display images. The non-display area NDA may be positioned around the display area DA. For example, the non-display area NDA may surround the display area DA and may be located in a periphery (or outside a footprint) of the display area DA.

The array substrate 100 may include a substrate, an insulating layer, elements for displaying an image, and the like. For example, the elements may include semiconductor elements (e.g., transistors), light emitting elements, and the like. A detailed description of the array substrate 100 will be described in more detail later.

The color conversion substrate 200 may be located on the array substrate 100. The color conversion substrate 200 may face the array substrate 100. The color conversion substrate 200 may include a color conversion layer that converts a wavelength of light emitted from the light emitting element. A detailed description of the color conversion substrate 200 will be described in more detail later.

The sealing portion 350 may be located between the array substrate 100 and the color conversion substrate 200 in the non-display area NDA. For example, the sealing portion 350 may be arranged along the edges of the array substrate 100 and the color conversion substrate 200 in the non-display area NDA to surround the display area DA in a plan view. Accordingly, the array substrate 100 and the color conversion substrate 200 may be coupled through the sealing portion 350. The sealing part 350 may include an organic material. For example, the sealing part 350 may include an organic material such as an epoxy resin. However, the present invention is not limited thereto, and the sealing part 350 may include other types of organic materials.

The filling layer 300 may be located between the array substrate 100 and the color conversion substrate 200 in the display area DA. For example, the filling layer 300 may fill between the array substrate 100 and the color conversion substrate 200 in the display area DA. The filling layer 300 may include a light transmitting material capable of transmitting light. For example, the filling layer 300 may include an organic material. Examples of organic materials that can be used for the filling layer 300 include silicone-based resin, epoxy-based resin, and the like. These may be used alone or in combination with each other. In other embodiments, the filling layer 300 may be omitted.

In this specification, a plane may be defined as the first direction D1 and the second direction D2 crossing the first direction D1. For example, the first direction D1 may be perpendicular to the second direction D2. In addition, a third direction D3 may be perpendicular to the first direction D1 and the second direction D2, respectively.

Figure 3:
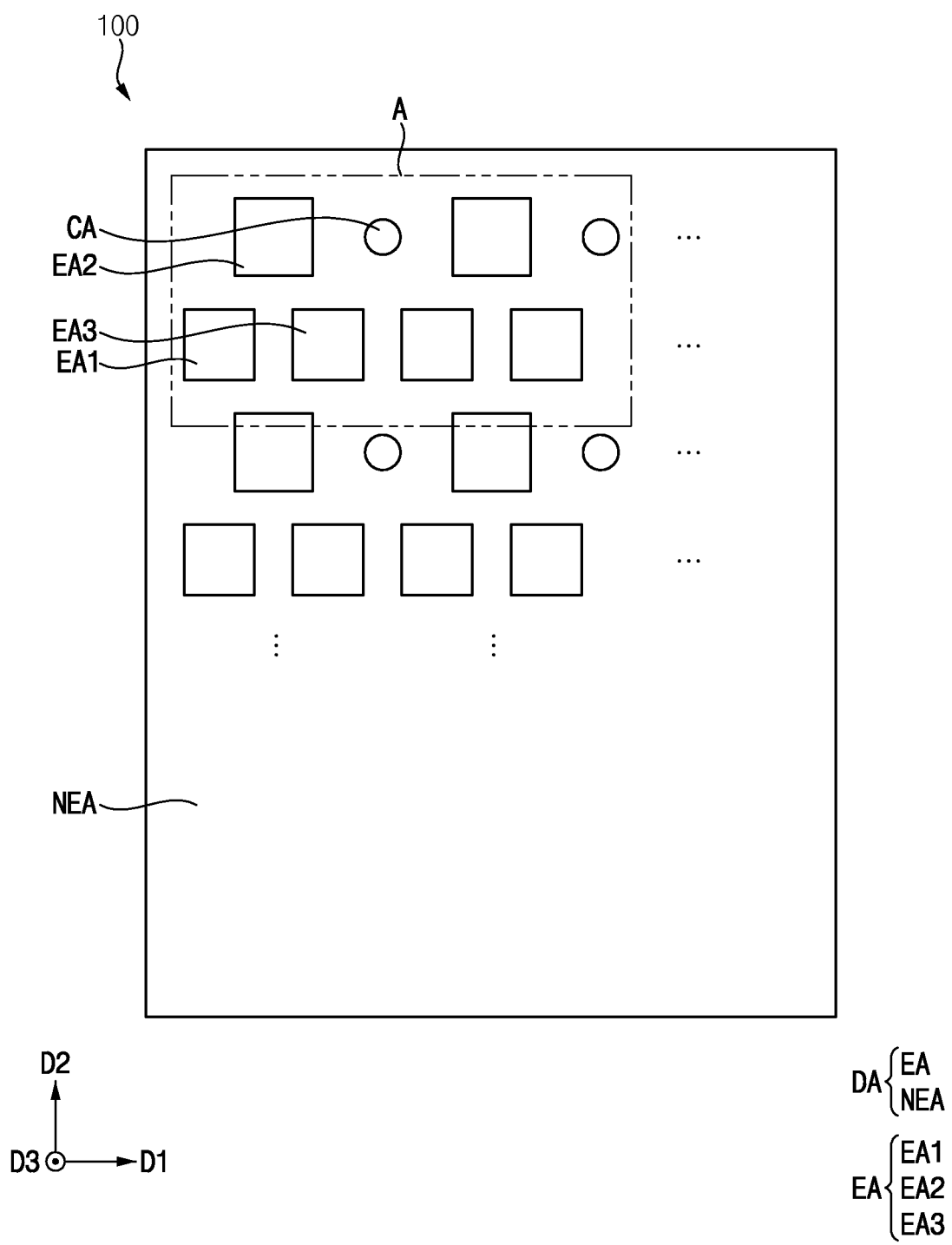
FIG. 3 is a plan view illustrating an array substrate of the display device of FIGS. 1 and 2 according to some embodiments.

FIG. 3 is a plan view illustrating an array substrate of the display device of FIGS. 1 and 2.

Figure 4:
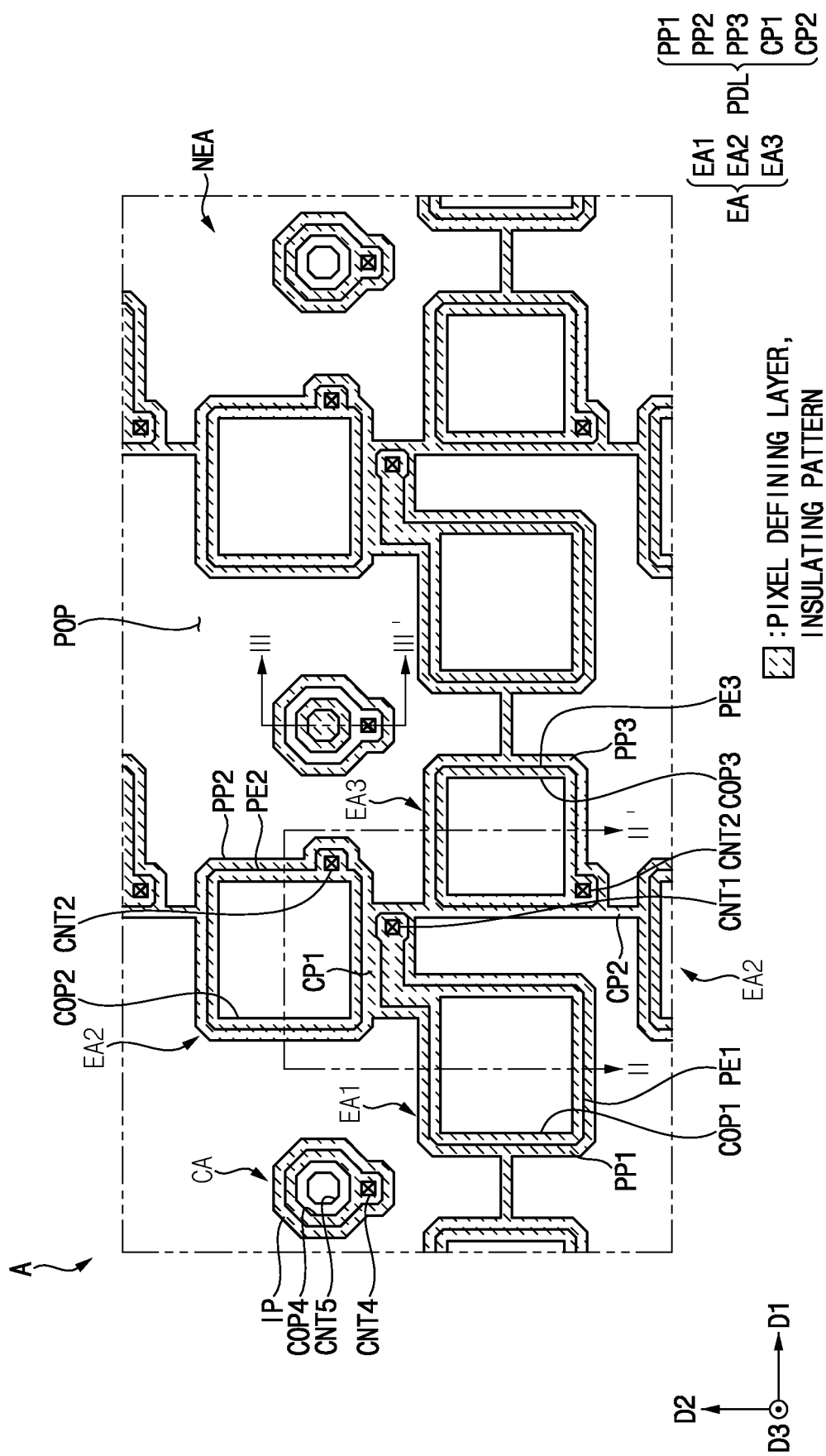
FIG. 4 is an enlarged plan view of the area A of FIG. 3 according to some embodiments.

Referring to FIGS. 3 and 4, the array substrate 100 may include a plurality of light emitting areas EA, a plurality of contact areas CA, and a non-light emitting area NEA.

Each of the light emitting areas EA may include a first light emitting area EA1, a second light emitting area EA2, and a third light emitting area EA3. Each of the first light emitting area EA1, the second light emitting area EA2, and the third light emitting area EA3 may be an area through which light emitted from the light emitting element is emitted to the outside of the array substrate 100.

The first light emitting area EA1, the second light emitting area EA2, and the third light emitting area EA3 may emit light of the same color. For example, the first light emitting area EA1, the second light emitting area EA2, and the third light emitting area EA3 may emit light of a first color. According to some embodiments, the first color may be blue.

Each of the first light emitting area EA1, the second light emitting area EA2, and the third light emitting area EA3 may have a triangular planar shape, a quadrangular planar shape, a circular planar shape, a track-shaped planar shape, an elliptical planar shape, or the like. According to some embodiments, each of the first light emitting area EA1, the second light emitting area EA2, and the third light emitting area EA3 may have a rectangular planar shape. However, the configuration of embodiments according to the present invention is not limited thereto.

In a plan view, the light emitting areas EA may be repeatedly arranged along a row direction and a column direction. For example, the light emitting areas EA may be repeatedly arranged along the first direction D1 and the second direction D2. For example, the second light emitting areas EA2 may be repeatedly arranged along the first direction D1 in odd-numbered rows (e.g., a first row). In addition, the first light emitting areas EA1 and the third light emitting areas EA3 may be alternately arranged along the first direction D1 in an even-numbered rows (e.g., a second row) adjacent to the odd-numbered rows.

In a plan view, the contact areas CA may be repeatedly arranged along the first direction D1 and the second direction D2 between the light emitting areas EA. For example, the contact areas CA may be repeatedly arranged along the first direction D1 in the odd-numbered rows. That is, each of the contact areas CA may be positioned between the second light emitting areas EA2. Each of the contact areas CA may be an area in which a laser drilling process is performed so that an auxiliary electrode (e.g., auxiliary electrode AE of FIG. 4) and a common electrode (e.g., common electrode CE of FIG. 3) are connected in order to lower a resistance of the common electrode.

The non-light emitting area NEA may be positioned between the light emitting areas EA and the contact areas CA. For example, the non-light emitting area NEA may surround the light emitting areas EA and the contact areas CA in a plan view. The non-light emitting area NEA may be an area other than the light emitting areas EA and the contact areas CA in the display area DA. That is, a light emitting element emitting light may not be located in the non-light emitting area NEA. In other words, the non-light emitting area NEA may not emit light.

FIG. 4 is an enlarged plan view of area A of FIG. 3.

Hereinafter, some of the components included in the array substrate 100 of FIGS. 1, 2, and 3 will be described in a plan view with reference to FIG. 4.

Referring to FIGS. 3 and 4, the array substrate 100 may include a first light emitting element (e.g., a first light emitting element EE1 of FIG. 5) including a first pixel electrode PE1 overlapping the first light emitting area EA1, a second light emitting element (e.g., a second light emitting element EE2 of FIG. 5) including a second pixel electrode PE2 overlapping the second light emitting area EA2, a third light emitting element (e.g., a third light emitting element EE3 of FIG. 5) including a third pixel electrode PE3 overlapping the third light emitting area EA3, an auxiliary electrode AE, a pixel defining layer PDL, and an insulating pattern IP.

The first pixel electrode PE1 may be electrically connected to a first transistor through a first contact hole CNT1. The second pixel electrode PE2 may be electrically connected to a second transistor through a second contact hole CNT2. The third pixel electrode PE3 may be electrically connected to a third transistor through a third contact hole CNT3. The first, second, and third contact holes CNT1, CNT2, and CNT3 may be spaced apart from each other.

The pixel defining layer PDL may cover edges of each of the first, second, and third pixel electrodes PE1, PE2, and PE3. In addition, a first central opening COP1 overlapping the first light emitting area EA1 and exposing a portion of an upper surface of the first pixel electrode PE1, a second central opening COP2 overlapping the second light emitting area EA2 and exposing a portion of an upper surface of the second pixel electrode PE2, and a third central opening COP3 overlapping the third light emitting area EA3 and exposing a portion of an upper surface of the third pixel electrode PE3 may defined in the pixel defining layer PDL According to some embodiments, a peripheral opening POP overlapping the non-light emitting area NEA may be defined in the pixel defining layer PDL. In detail, the peripheral opening POP may partially overlap the non-light emitting area NEA. In this case, the peripheral opening POP may not overlap the first, second, and third pixel electrodes PE1, PE2, and PE3. That is, the peripheral opening POP may be spaced apart from the first, second, and third pixel electrodes PE1, PE2, and PE3 in a plan view.

The pixel defining layer PDL may continuously extend along the first, second, and third light emitting areas EA1, EA2, and EA3. However, the present invention is not limited thereto. Alternatively, the pixel defining layer PDL may continuously extend along at least two light emitting areas among the first, second, and third light emitting areas EA1, EA2, and EA3. For example, the pixel defining layer PDL may continuously extend along the first and second light emitting areas EA1 and EA2. In this case, a portion of the pixel defining layer PDL may be independently located in the third light emitting area EA3.

The insulating pattern IP may overlap the contact area CA and may cover an edge of the auxiliary electrode AE. According to some embodiments, the insulating pattern IP may be located only on the edge of the auxiliary electrode AE. For example, the insulating pattern IP may have an island shape in a plan view. In addition, a fourth central opening COP4 overlapping the contact area CA may be defined in the insulating pattern IP.

According to some embodiments, the insulating pattern IP may be arranged to be spaced apart from the pixel defining layer PDL. That is, the insulating pattern IP may be arranged independently of the pixel defining layer PDL. In other words, the insulating pattern IP may not be connected to the pixel defining layer PDL.

The peripheral opening POP partially overlapping the non-pixel area NPA may be defined in the insulating pattern IP. That is, the pixel defining layer PDL and the insulating pattern IP may share the peripheral opening POP. Due to the peripheral opening POP, the pixel defining layer PDL and the insulating pattern IP may be separated from each other.

According to some embodiments, the pixel defining layer PDL may be located only on edges of each of the first, second, and third pixel electrodes PE1, PE2, and PE3. For example, the pixel defining layer PDL may include a first pattern portion PP1, a second pattern portion PP2, a third pattern portion PP3, a first connection portion CP1, and second connection portions CP2.

According to some embodiments, the first pattern portion PP1 may cover the edge of the first pixel electrode PE1, the second pattern portion PP2 may cover the edge of the second pixel electrode PE2, and the third pattern portion PP3 may cover the edge of the third pixel electrode PE3.

The first connection portion CP1 may overlap a protruding portion of the first pixel electrode PE1. For example, the first connection portion CP1 may overlap a portion of the first pixel electrode PE1 in which the first contact hole CNT1 is positioned. According to some embodiments, the first connection part CP1 may connect the first, second, and third pattern parts PP1, PP2, and PP3 positioned in one light emitting area EA. That is, the first, second, and third pattern portions PP1, PP2, and PP3 positioned in one light emitting area EA may continuously extend due to the first connection portion CP1.

The second connection parts CP2 may connect two pattern portions among the first, second, and third pattern portions PP1, PP2, and PP3. According to some embodiments, the second connection portions CP2 may include a second connection portion CP2 extending in the first direction D1 and a second connection portion CP2 extending in the second direction D2. For example, the second connection portion CP2 extending in the first direction D1 may connect the first pattern portion PP1 and the third pattern portion PP3 adjacent to the first pattern portion PP1 in a direction opposite to the first direction D1. The second connection portion CP2 extending in the second direction may connect the second pattern portion PP2 and the third pattern portion PP3 adjacent to the second pattern portion PP2 in the second direction D2. That is, two adjacent pattern portions may be connected due to the second connection portion CP2.

According to some embodiments, the second connection portion CP2 may overlap the non-light emitting area NPA without overlapping the first, second, and third light emitting areas EA1, EA2, and EA3. That is, the first, second, and third pixel electrodes PE1, PE2, and PE3 may not be located under the second connection portion CP2.

A width of the second connection portion CP2 may be different from a width of each of the first, second, and third pattern portions PP1, PP2, and PP3. According to some embodiments, the width of the second connection part CP2 may be smaller than a width of each of the first, second, and third pattern portions PP1, PP2, and PP3.

Figure 5:
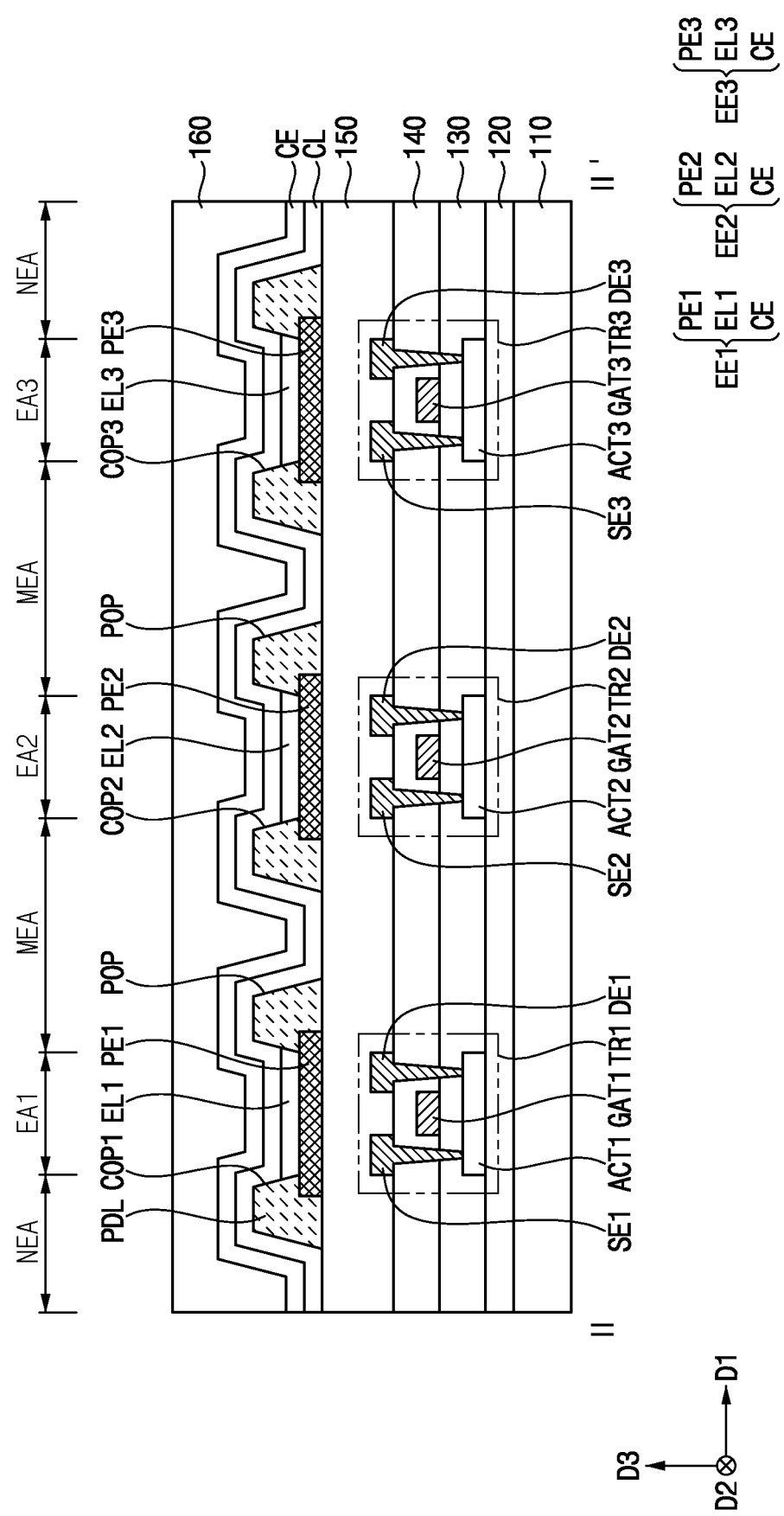
FIG. 5 is a cross-sectional view taken along the line II-II' of FIG. 4 according to some embodiments.
Figure 6:
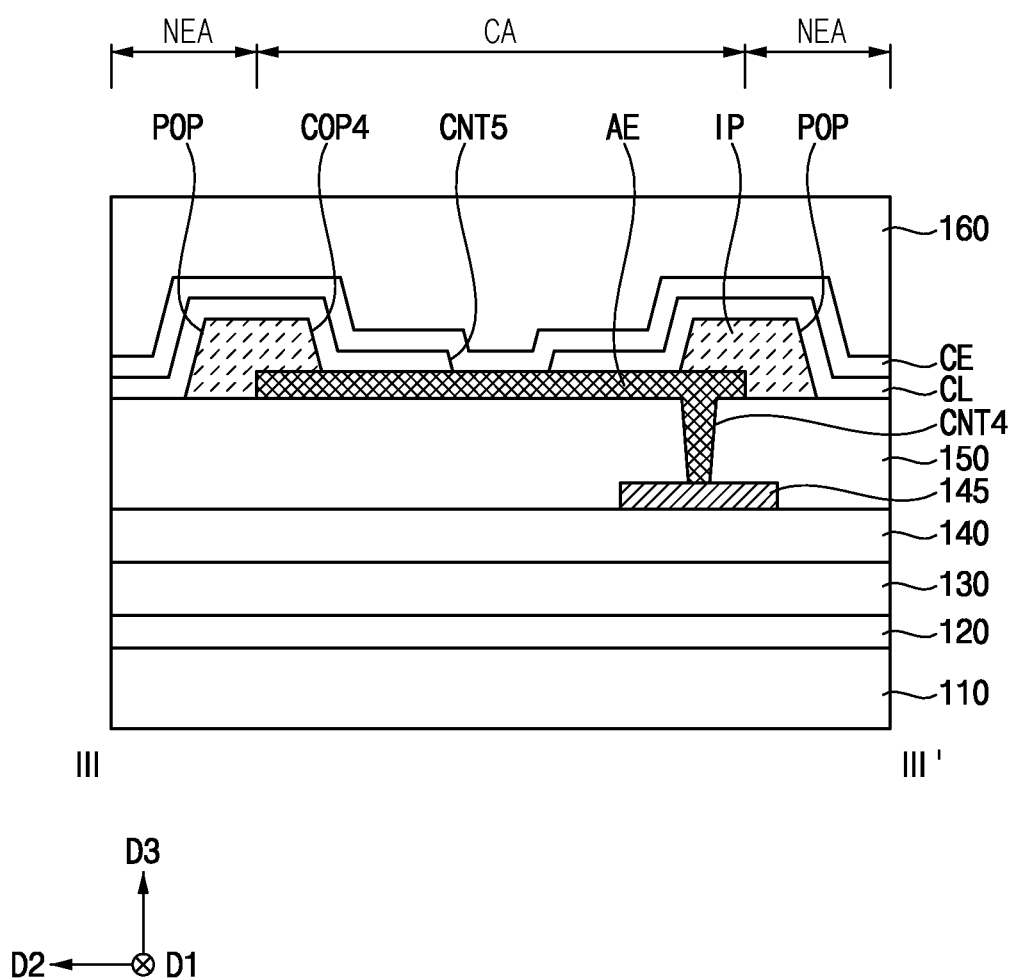
FIG. 6 is a cross-sectional view taken along the line III-III' of FIG. 4 according to some embodiments.

FIG. 5 is a cross-sectional view taken along line II-II' of FIG. 4. FIG. 6 is a cross-sectional view taken along the line III-III' of FIG. 4.

Hereinafter, components included in the array substrate 100 will be described in more detail according to the stacked structure.

Referring to FIGS. 5 and 6, the array substrate 100 may include a first substrate 110, a buffer layer 120, a gate insulating layer 130, first, second, and third transistors TR1, TR2, and TR3, an interlayer insulating layer 140, a conductive pattern 145, a planarization layer 150, a pixel defining layer PDL, an insulating pattern IP, first, second, and third light emitting elements EE1, EE2, and EE3, a common layer CL, and an encapsulation layer 160.

Here, the first transistor TR1 may include a first active layer ACT1, a first gate electrode GAT1, a first source electrode SE1, and a first drain electrode DE1. The second transistor TR2 may include a second active layer ACT2, a second gate electrode GAT2, a second source electrode SE2, and a second drain electrode DE2. The third transistor TR3 may include a third active layer ACT3, a third gate electrode GAT3, a third source electrode SE3, and a third drain electrode DE3.

In addition, the first light emitting element EE1 may include a first pixel electrode PE1, a first light emitting layer EL1, and a common electrode CE. The second light emitting element EE2 may include a second pixel electrode PE2, a second light emitting layer EL2, and a common electrode CE. The third light emitting element EE3 may include a third pixel electrode PE3, a third light emitting layer EL3, and a common electrode CE.

As described above, the array substrate 100 may include the light emitting areas EA, the contact areas CA, and the non-light emitting areas NEA. As the array substrate 100 includes the light emitting areas EA, the contact areas CA, and the non-emitting areas NEA, components included in the array substrate 100 (e.g., the first substrate 110 and the like) may also include the light emitting areas EA, the contact areas CA, and the non-emitting areas NEA.

The first substrate 110 may include a transparent material or an opaque material. The first substrate 110 may be made of a transparent resin substrate. Examples of the transparent resin substrate may include polyimide substrates and the like. In this case, the polyimide substrate may include a first organic layer, a first barrier layer, and a second organic layer. Alternatively, the first substrate 110 may include a quartz substrate, a synthetic quartz substrate, a calcium fluoride substrate, an F-doped quartz substrate, sodalime glass substrate, a non-alkali glass substrate, and the like. These may be used alone or in combination with each other.

The buffer layer 120 may be located on the first substrate 110. The buffer layer 120 may prevent or reduce diffusion of metal atoms, contaminants, or impurities from the first substrate 110 into the transistors TR1, TR2, and TR3. In addition, the buffer layer 120 may improve the flatness of the surface of the first substrate 110 when the surface of the first substrate 110 is not uniform. For example, the buffer layer 120 may include an inorganic material such as silicon oxide, silicon nitride, silicon oxynitride, and the like. These may be used alone or in combination with yarn.

The first, second, and third active layers ACT1, ACT2, and ACT3 may be located on the buffer layer 120. Each of the first, second, and third active layers ACT1, ACT2, and ACT3 may include a metal oxide semiconductor, an inorganic semiconductor (e.g., amorphous silicon, poly silicon), or an organic semiconductor. The first, second, and third active layers ACT1, ACT2, and ACT3 may include the same material. For example, each of the first, second, and third active layers ACT1, ACT2, and ACT3 may include a source region, a drain region, and a channel region positioned between the source region and the drain region.

The metal oxide semiconductor may include a two-component compound ("$AB_x$"), a ternary compound ("$AB_xC_y$"), a four-component compound ("$AB_xC_yD_z$"), and the like containing indium ("In"), zinc ("Zn"), gallium ("Ga"), tin ("Sn"), titanium ("Ti"), aluminum ("Al"), hafnium ("Hf"), zirconium ("Zr"), and magnesium ("Mg"), and the like. For example, the metal oxide semiconductor may be zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), and the like. These may be used alone or in combination with each other.

The gate insulating layer 130 may be located on the buffer layer 120. The gate insulating layer 130 may sufficiently cover the first, second, and third active layers ACT1, ACT2, and ACT3 and does not create a step around the first, second, and third active layers ACT1, ACT2, and ACT3 to have a substantially flat upper surface. Alternatively, the gate insulating layer 130 may cover the first, second, and third active layers ACT1, ACT2, and ACT3 and may be arranged along the profile of each of the first, second, and third active layers ACT1, ACT2, and ACT3 to have a uniform thickness. For example, the gate insulating layer 130 may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. These may be used alone or in combination with each other.

The first, second, and third gate electrodes GAT1, GAT2, and GAT3 may be located on the gate insulating layer 130. The first gate electrode GAT1 may overlap the channel region of the first active layer ACT1, the second gate electrode GAT2 may overlap the channel region of the second active layer ACT2, and the third gate electrode GAT3 may overlap the channel region of the third active layer ACT3. For example, each of the first, second, and third gate electrodes GAT1, GAT2, and GAT3 may include a metal, an alloy, a metal nitride, a conductive metal oxide, a transparent conductive material, and the like. These may be used alone or in combination with each other. The first, second, and third gate electrodes GAT1, GAT2, and GAT3 may include the same material.

The interlayer insulating layer 140 may be located on the gate insulating layer 130. The interlayer insulating layer 140 may sufficiently cover the first, second, and third gate electrodes GAT1, GAT2, and GAT3 and does not create a step around the first, second, and third gate electrodes GAT1, GAT2, and GAT3 to have a substantially flat upper surface. Alternatively, the interlayer insulating layer 140 may cover the first, second, and third gate electrodes GAT1, GAT2, and GAT3 and may be arranged along the profile of each of the first, second, and third gate electrodes GAT1, GAT2, and GAT3 to have a uniform thickness. For example, the interlayer insulating layer 140 may include an inorganic material such as silicon oxide, silicon nitride, silicon carbide, silicon oxynitride, silicon oxycarbide, and the like. These may be used alone or in combination with each other.

The first, second, and third source electrodes SE1, SE2, and SE3 may be located on the interlayer insulating layer 140. The first source electrode SE1 may be connected to the source region of the first active layer ACT1 through a contact hole passing through the gate insulating layer 130 and the interlayer insulating layer 140. The second source electrode SE2 may be connected to the source region of the second active layer ACT2 through a contact hole passing through the gate insulating layer 130 and the interlayer insulating layer 140. The third source electrode SE3 may be connected to the source region of the third active layer ACT3 through a contact hole passing through the gate insulating layer 130 and the interlayer insulating layer 140.

The first, second, and third drain electrodes DE1, DE2, and DE3 may be located on the interlayer insulating layer 140. The first drain electrode DE1 may be connected to the drain region of the first active layer ACT1 through a contact hole penetrating the gate insulating layer 130 and the interlayer insulating layer 140. The second drain electrode DE2 may be connected to the drain region of the second active layer ACT2 through a contact hole penetrating the gate insulating layer 130 and the interlayer insulating layer 140. The third drain electrode DE3 may be connected to the drain region of the third active layer ACT3 through a contact hole penetrating the gate insulating layer 130 and the interlayer insulating layer 140.

For example, each of the first, second, and third source electrodes SE1, SE2, and SE3 may include a metal, an alloy, a metal nitride, a conductive metal oxide, a transparent conductive material, and the like. These may be used alone or in combination with each other. The first, second, and third drain electrodes DE1, DE2, and DE3 may include the same material as the first, second, and third source electrodes SE1, SE2, and SE3.

Accordingly, the first transistor TR1 including the first active layer ACT1, the first gate electrode GAT1, the first source electrode SE1, and the first drain electrode DE1 may be located on the first substrate 110. The second transistor TR2 including the second active layer ACT2, the second gate electrode GAT2, the second source electrode SE2, and the second drain electrode DE2 may be located on the first substrate 110. The third transistor TR3 including the third active layer ACT3, the third gate electrode GAT3, the third source electrode SE3, and the third drain electrode DE3 may be located on the substrate 110.

The conductive pattern 145 may be located in the contact area CA on the interlayer insulating layer 140. For example, the conductive pattern 145 may include a metal, an alloy, a metal nitride, a conductive metal oxide, a transparent conductive material, and the like. These may be used alone or in combination with each other.

According to some embodiments, the conductive pattern 145 may include the same material as the first, second, and third source electrodes SE1, SE2, and SE3 (or the first, second, and third drain electrodes DE1, DE2, and DE3). That is, the conductive pattern 145 may be located on the same layer as the first, second, and third source electrodes SE1, SE2, and SE3 (or the first, second, and third drain electrodes DE1, DE2, and DE3).

The planarization layer 150 may be located on the interlayer insulating layer 140. The planarization layer 150 may sufficiently cover the first, second, and third source electrodes SE1, SE2, and SE3, the first, second, and third drain electrodes DE1, DE2, and DE3, and the conductive pattern 145. The planarization layer 150 may include an organic material. For example, the planarization layer 150 may include phenolic resin, polyacrylates resin, polyimides rein, polyamides resin, siloxane resin, epoxy resin, and the like. These may be used alone or in combination with each other.

The first, second, and third pixel electrodes PE1, PE2, and PE3 may be located on each of the first, second, and third light emitting areas EA1, EA2, and EA3 on the planarization layer 150. For example, the first pixel electrode PE1 may be located in the first light emitting area EA1, the second pixel electrode PE2 may be located in the second light emitting area EA2, and the third pixel electrode PE3 may be located in the third light emitting area EA3. The first pixel electrode PE1 may be connected to the first drain electrode DE1 through the first contact hole CNT1 penetrating the planarization layer 150, the second pixel electrode PE2 may be connected to the second drain electrode DE2 through the second contact hole CNT2 penetrating the planarization layer 150, and the third pixel electrode PE3 may be connected to the third drain electrode DE3 through the third contact hole CNT3 penetrating the planarization layer 150.

For example, each of the first, second, and third pixel electrodes PE1, PE2, and PE3 may include a metal, an alloy, a metal nitride, a conductive metal oxide, a transparent conductive material, and the like. These may be used alone or in combination with each other. According to some embodiments, each of the first, second, and third pixel electrodes PE1, PE2, and PE3 may have a stacked structure including ITO/Ag/ITO. The first, second, and third pixel electrodes PE1, PE2, and PE3 may include the same material. For example, each of the first, second, and third pixel electrodes PE1, PE2, and PE3 may function as an anode.

The auxiliary electrode AE may be located in the contact area CA on the planarization layer 150. The auxiliary electrode AE may be connected to the conductive pattern 145 through the fourth contact hole CNT4 penetrating the planarization layer 150. For example, the auxiliary electrode AE may include a metal, an alloy, a metal nitride, a conductive metal oxide, a transparent conductive material, and the like. These may be used alone or in combination with each other.

According to some embodiments, the auxiliary electrode AE may include the same material as the first, second, and third pixel electrodes PE1, PE2, and PE3. That is, the auxiliary electrode AE may be located on the same layer as the first, second, and third pixel electrodes PE1, PE2, and PE3.

The pixel defining layer PDL may be located on the planarization layer 150. The pixel defining layer PDL may cover edges of each of the first, second, and third pixel electrodes PE1, PE2, and PE3. In addition, the first central opening COP1 exposing a portion of the upper surface of the first pixel electrode PE1, the second central opening COP2 exposing a portion of the upper surface of the second pixel electrode PE3, and the third central opening COP3 exposing a portion of the upper surface of the third pixel electrode PE3 may be defined in the pixel defining layer PDL.

The pixel defining layer PDL may include an inorganic material or an organic material. According to some embodiments, the pixel defining layer PDL may include an organic material. For example, the pixel defining layer PDL may include an organic material such as polyimide ("PI"). However, organic materials that may be used for the pixel defining layer PDL are not limited thereto.

The pixel defining layer PDL may further include a black light blocking material. For example, the pixel defining layer PDL may further include a light blocking material such as black pigment, black dye, carbon black, and the like. These may be used alone or in combination with each other.

The insulating pattern IP may be located on the planarization layer 150. The insulating pattern IP may partially overlap the contact area CA. The insulating pattern IP may cover an edge of the auxiliary electrode AE. In addition, the fourth central opening COP4 exposing a portion of the upper surface of the auxiliary electrode AE may be defined in the insulating pattern IP.

According to some embodiments, the insulating pattern IP may include the same material as the pixel defining layer PDL. That is, the insulating pattern IP may be located on the same layer as the pixel defining layer PDL.

According to some embodiments, the peripheral opening POP exposing the upper surface of the planarization layer 150 in the non-light emitting area NEA may be defined in the pixel defining layer PDL and the insulating pattern IP. In other words, the peripheral opening POP may be formed between the pixel defining layer PDL and the insulating pattern IP.

The first, second, and third light emitting layers EL1, EL2, and EL3 may be located on the first, second, and third pixel electrodes PE1, PE2, and PE3. For example, the first, second, and third light emitting layers EL1, EL2, and EL3 may be located in the first, second, and third central openings OP1, OP2, and OP3, respectively.

Each of the first, second, and third light emitting layers EL1, EL2, and EL3 may be formed using at least one of light emitting materials capable of emitting red light, green light, and blue light. According to some embodiments, the first, second, and third light emitting layers EL1, EL2, and EL3 may emit blue light. For example, each of the first, second, and third light emitting layers EL1, EL2, and EL3 may include a low-molecular organic compound or a high-molecular organic compound.

The common layer CL may be located on the planarization layer 150, the auxiliary electrode AE1, the first light emitting layer EL1, the second light emitting layer EL2, and the third light emitting layer EL3. The common layer CL may include a hole injection layer, a hole transport layer, an electron transport layer, an electron injection layer, and the like. According to some embodiments, the first, second, and third light emitting layers EL1, EL2, and EL3 may be located between the hole transport layer and the electron transport layer.

A fifth contact hole CNT5 may be formed in the contact area CA to expose a portion of the upper surface of the auxiliary electrode AE by penetrating the common layer CL. According to some embodiments, the fifth contact hole CNT5 may be formed by removing a portion of the common layer CL through a laser drilling process. According to some embodiments, the fifth contact hole CNT5 may be formed by removing a portion of the common layer CL through an organic layer taper adjustment process or an organic layer reverse taper adjustment process.

The common electrode CE may be located on the common layer CL. The common electrode CE may include a metal, an alloy, a metal nitride, a conductive metal oxide, a transparent conductive material, and the like. These may be used alone or in combination with each other. According to some embodiments, the common electrode CE may have a stacked structure including Mg and Ag. For example, the common electrode CE may operate as a cathode.

According to some embodiments, the common electrode CE may be connected to the auxiliary electrode AE through the fifth contact hole CNT5 of the common layer CL in the contact area CA. That is, in the contact area CA, the common electrode CE may be electrically connected to the auxiliary electrode AE through the fifth contact hole CNT5 of the common layer CL. Accordingly, resistance of the common electrode CE may be reduced.

Accordingly, the first light emitting element EE1 including the first pixel electrode PE1, the first light emitting layer EL1, and the common electrode CE may be located in the first light emitting area EA1 on the first substrate 110. The second light emitting element EE2 including the second pixel electrode PE2, the second light emitting layer EL2 and the common electrode CE may be located in the second light emitting area EA2 on the first substrate 110. The third light emitting element EE3 including the third pixel electrode PE3, the third light emitting layer EL3, and the common electrode CE may be located in the third light emitting area EA3 on the first substrate 110.

The encapsulation layer 160 may be located on the common electrode CE. The encapsulation layer 160 may prevent or reduce instances of impurities, moisture, outside air, or other contaminants, and the like permeating the first, second, and third light emitting elements EE1, EE2, and EE3 from the outside. The encapsulation layer 160 may include at least one inorganic encapsulation layer and at least one organic encapsulation layer. For example, the inorganic encapsulation layer may include silicon oxide, silicon nitride, silicon oxynitride, and the like. These may be used alone or in combination with each other. The organic encapsulation layer may include a polymer cured material such as polyacrylate.

Figure 7:
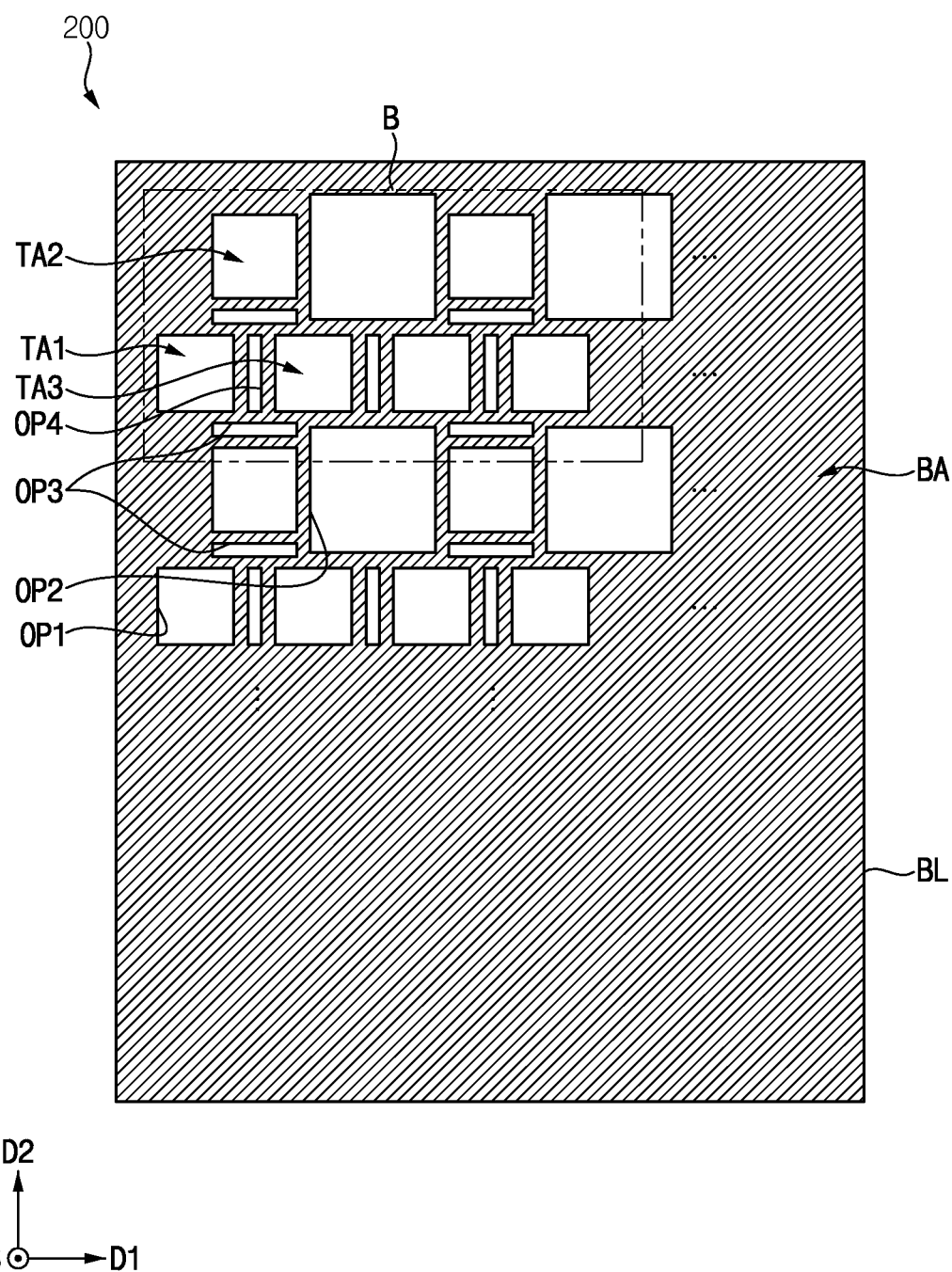
FIG. 7 is a plan view illustrating a color conversion substrate of the display device of FIGS. 1 and 2 according to some embodiments.

FIG. 7 is a plan view illustrating a color conversion substrate of the display device of FIGS. 1 and 2.

Figure 8:
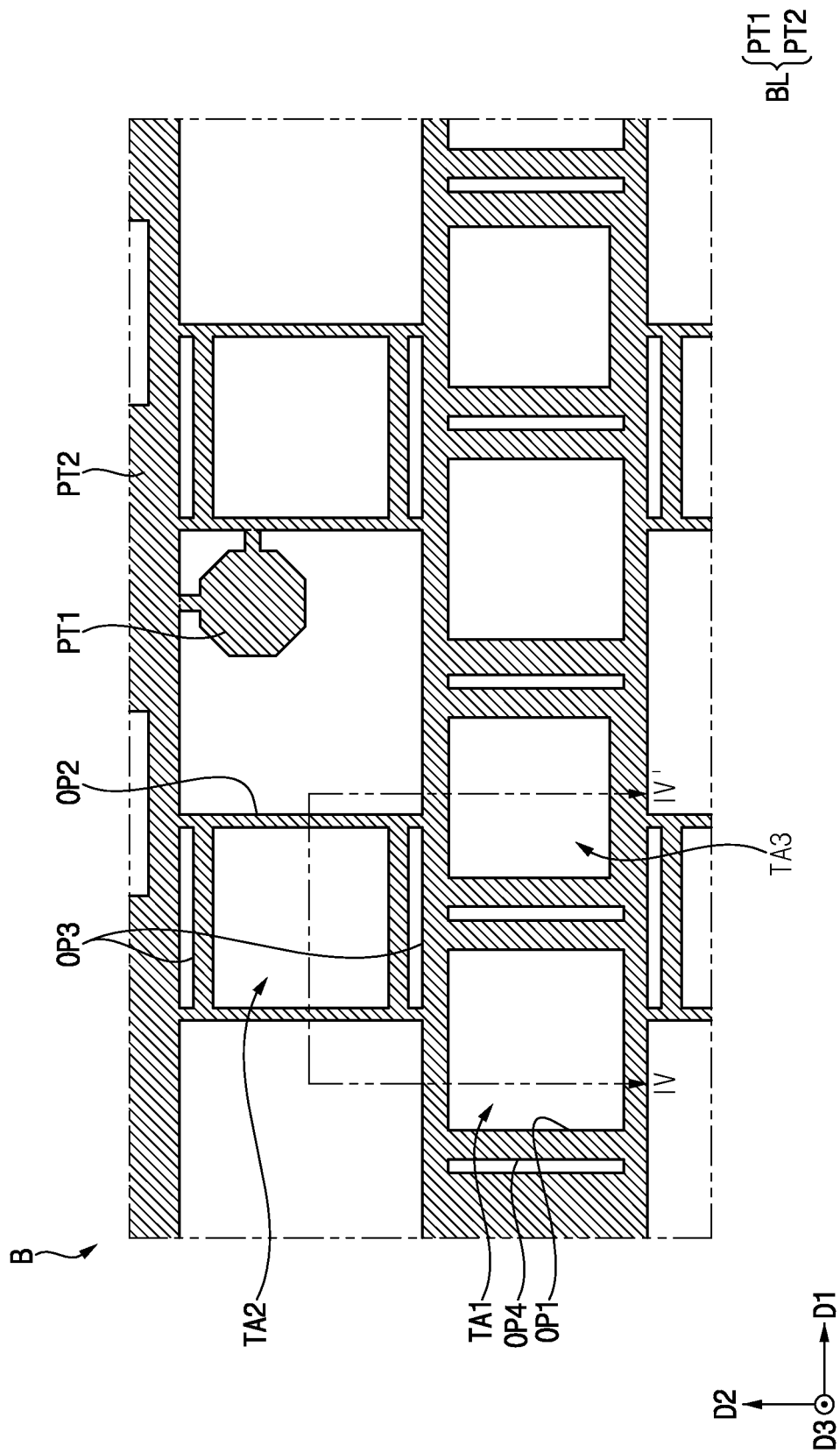
FIG. 8 is an enlarged plan view of the area B of FIG. 7 according to some embodiments.

Referring to FIGS. 7 and 8, the color conversion substrate 200 may include a first light transmitting area TA1, a second light transmitting area TA2, a third light transmitting area TA3, and a light blocking area BA. Each of the first light transmitting area TA1, the second light transmitting area TA2, and the third light transmitting area TA3 may be an area in which light emitted from the array substrate 100 transmits the color conversion substrate 200 and is provided to the outside of the display device 1000.

Light of different colors may be transmitted to the outside of the display device 1000 through the first light transmitting area TA1, the second light transmitting area TA2, and the third light transmitting area TA3. For example, light of a first color may be transmitted through the first light transmitting area TA1, light of a second color may be transmitted through the second light transmitting area TA2, and light of a third color may be transmitted through the third light transmitting area TA3. According to some embodiments, the first color may be red, the second color may be green, and the third color may be blue. However, the present invention is not limited thereto.

In a plan view, the light transmitting areas TA1, TA2, and TA3 may be repeatedly arranged along a row direction and a column direction. For example, the light transmitting areas TA1, TA2, and TA3 may be repeatedly arranged along the first direction D1 and the second direction D2. For example, the second light transmitting areas TA2 may be repeatedly arranged along the first direction D1 in odd-numbered rows (e.g., a first row). In addition, the first light transmitting areas TA1 and the third light transmitting areas TA3 may be alternately arranged along the first direction D1 in even-numbered rows (e.g., a second row) adjacent to the odd-numbered rows.

The light blocking area BA may be positioned between the first light transmitting area TA1, the second light transmitting area TA2, and the third light transmitting area TA3. For example, the light blocking area BA may surround the first light transmitting area TA1, the second light transmitting area TA2, and the third light transmitting area TA3 in a plan view. The light blocking area BA may be an area other than the first light transmitting area TA1, the second light transmitting area TA2, and the third light transmitting area TA3. That is, the blocking area BA may be an area through which light emitted from the array substrate 100 is not transmitted.

Figure 9:
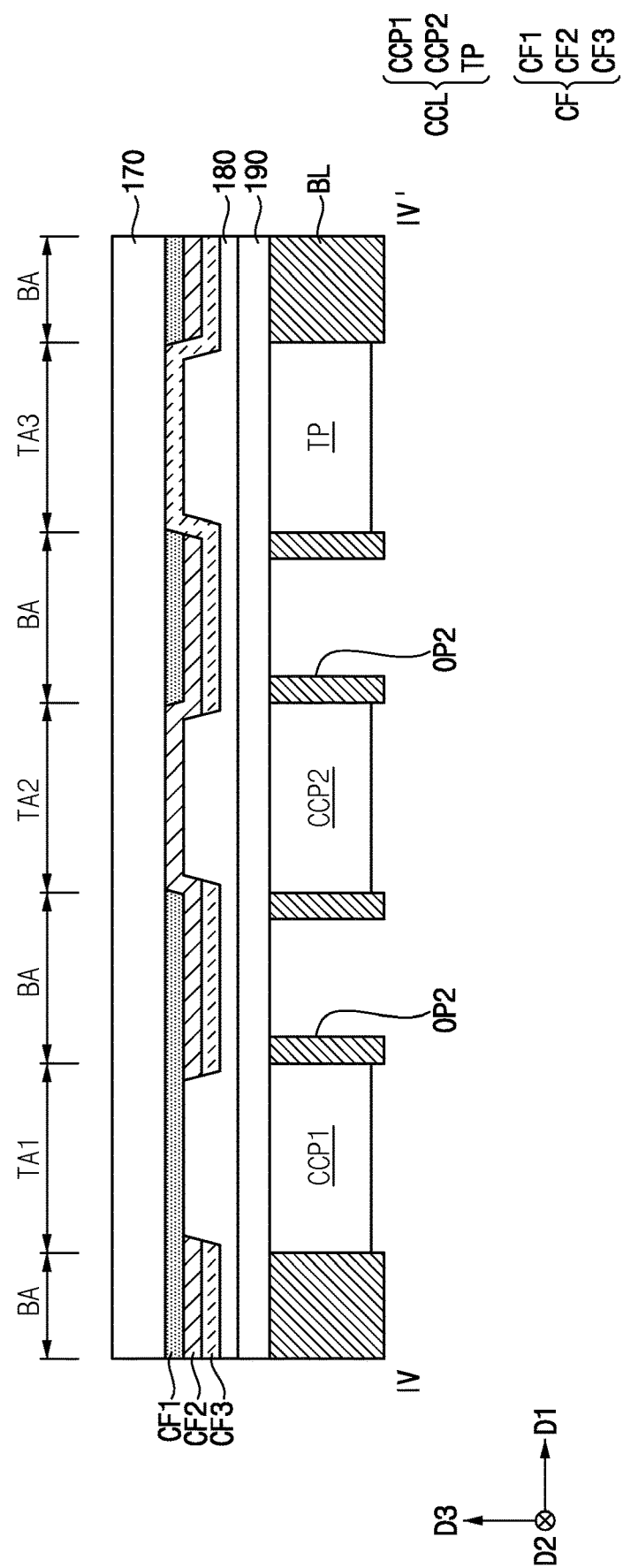
FIG. 9 is a cross-sectional view taken along the line IV-IV' of FIG. 8 according to some embodiments.

FIG. 8 is an enlarged plan view of area B of FIG. 7. FIG. 9 is a cross-sectional view taken along the line IV-IV' of FIG. 8.

Referring to FIGS. 7, 8 and 9, the color conversion substrate 200 may include a second substrate 170, a color filter layer CF, a low refractive index layer 180, a protective layer 190, a color conversion layer CCL, and a bank layer BL.

As described above, the color conversion substrate 200 may include the light transmitting areas TA and the light blocking areas BA. As the color conversion substrate 200 includes light transmitting areas TA and light blocking areas BA, components (e.g., the second substrate 170 and the like) included in the color conversion substrate 200 may include the light transmitting areas TA and the light blocking areas BA.

The second substrate 170 may transmit light emitted from the light emitting element (e.g., the first, second, and third light emitting elements EE1, EE2, and EE3 of FIG. 5). For example, the second substrate 170 may be formed of a transparent resin substrate. The second substrate 170 may include an insulating material such as glass or plastic. Alternatively, the second substrate 170 may include an organic polymer material such as polycarbonate ("PC"), polyethylene ("PE"), polypropylene ("PP"), and the like. These may be used alone or in combination with each other.

The color filter layer CF may be located under the second substrate 170. The color filter layer CF may selectively transmit light having a specific wavelength. For example, the color filter layer CF may include a first color filter layer CF1, a second color filter layer CF2, and a third color filter layer CF3. The first color filter layer CF1 may overlap the first transmitting area TA1 and the light blocking area BA. The second color filter layer CF2 may overlap the second light transmitting area TA2 and the light blocking area BA. The third color filter layer CF3 may overlap the third light transmitting area TA3 and the light blocking area BA.

The first color filter layer CF1 may selectively transmit light having a first wavelength (e.g., red light). The second color filter layer CF2 may selectively transmit light having a second wavelength (e.g., green light). The third color filter layer CF3 may selectively transmit light having a third wavelength (e.g., blue light).

A light blocking layer may be located under the second substrate 170. The light blocking layer may overlap the light blocking area BA. Light emitted from the light emitting element (e.g., the first, second, and third light emitting elements EE1, EE2, and EE3 of FIG. 5) may transmit only a partial area of the color conversion substrate 200. That is, the light emitted from the light emitting element may transmit only an area of the color conversion substrate 200 overlapping the first, second, and third light transmitting areas TA1, TA2, and TA3, and may not transmit an area of the color conversion substrate 200 overlapping the light blocking area BA. According to some embodiments, the light blocking layer may be formed by overlapping and stacking the first, second, and third color filter layers CF1, CF2, and CF3.

According to some embodiments, the light blocking layer may include a light blocking material. For example, the light blocking material may have a specific color.

The low refractive index layer 180 may be located under the color filter layer CF. The low refractive index layer 180 may cover the color filter layer 220. The low refractive index layer 180 may have a relatively low refractive index. For example, the refractive index of the low refractive index layer 180 may be lower than the refractive index of the color conversion layer 260. The low refractive index layer 180 may include an organic material. For example, the low refractive index layer 180 may include an organic polymer material including silicon.

The protective layer 190 may be located under the low refractive index layer 180. The protective layer 190 may cover the low refractive index layer 180. The protective layer 190 may block external impurities to prevent or reduce contamination of the color filter layer CF. The protective layer 190 may include an inorganic material. For example, the protective layer 190 may include silicon oxide, silicon nitride, aluminum nitride, and the like. These may be used alone or in combination with each other.

The bank layer BL may be located under the protective layer 190. The bank layer BL may overlap the light blocking area BA. For example, the bank layer BL may include an organic material such as polyimide. Alternatively, the bank layer BL may include an organic material containing a light blocking material.

The bank layer BL may block light emitted from a first color conversion pattern CCP1 from being irradiated to a second color conversion pattern CCP2 or a transmitting pattern TP, light emitted from the second color conversion pattern CCP2 from being irradiated to the first color conversion pattern CCP1 or the transmitting pattern TP, or light emitted from the transmitting pattern TP from being irradiated to the first color conversion pattern CCP1 or the second color conversion pattern CCP2.

According to some embodiments, a first opening OP1 and a second opening OP2 may be defined in the bank layer BL.

The first opening OP1 may overlap the first light transmitting area TA1, the second light transmitting area TA2, and the third light transmitting area TA3, respectively. The first opening OP1 may expose a portion of a lower surface of the protective layer 190. The color conversion layer CCL may be formed in the first opening OP1 by an inkjet method.

The second opening OP2 may overlap the light blocking area BA. According to some embodiments, the second opening OP2 may expose a portion of the lower surface of the protective layer 190. The second opening OP2 may accommodate misplaced ink ejected by an inkjet method in the process of forming the color conversion layer CCL.

The first opening OP1 may be repeatedly arranged along the first direction D1 and the second direction D2. In addition, the second opening OP2 may be repeatedly arranged along the first direction D1 and the second direction D2. For example, the first openings OP1 overlapping the second light transmitting area TA2 may be repeatedly arranged in odd-numbered rows (e.g., a first row), and the second openings OP2 may be repeatedly arranged in the odd-numbered rows with the first openings OP1 overlapping the second transmitting area TA2 interposed therebetween. In addition, the first openings OP1 overlapping the first and third light transmitting areas TA1 and TA2 may be repeatedly arranged in the even-numbered rows (e.g., a second row) adjacent to the odd-numbered rows.

The second opening OP2 may have a polygonal planar shape, a circular planar shape, a track-shaped planar shape, an elliptical planar shape, or the like. According to some embodiments, the second opening OP2 may have a rectangular planar shape. However, the planar shape of the second opening OP2 is not limited thereto.

An area of the second opening OP2 may be different from an area of the first opening OP1. According to some embodiments, the area of the second opening OP2 may be greater than the area of the first opening OP1.

Here, the first opening OP1 may denote to a portion of the bank layer BL filled with the material of the color conversion layer CCL and the second opening OP2 may denote to a portion of the bank layer BL filled with the material of the filling layer 300. In other words, each of the first opening OP1 and the second opening OP2 may denote to a portion in which a portion of the protective layer 190 contacts a component (e.g., the color conversion layer CCL, filling layer 300, and the like) other than the bank layer BL.

According to some embodiments, a third opening OP3 and a fourth opening OP4 may be further defined in the bank layer BL. The third opening OP3 may extend in the first direction D1 and the fourth opening OP4 may extend in the second direction D2.

The third openings OP3 may be repeatedly arranged along the second direction D2 with the first opening OP1 overlapping the second light transmitting area TA2 interposed therebetween. The fourth opening OP4 may be repeatedly arranged along the first direction D1 with the first opening OP1 interposed between the first and third light transmitting areas TA1 and TA3. The third and fourth openings OP3 and OP4 may accommodate misplaced ink ejected by the inkjet method in the process of forming the color conversion layer CCL.

Here, each of the third opening OP3 and the fourth opening OP4 may denote a portion of the bank layer BL filled with the material of the filling layer 300. In other words, each of the third and fourth openings OP3 and OP4 may denote to a portion in which a portion of the protective layer 190 contacts a component (e.g., the filling layer 300) other than the bank layer BL.

According to some embodiments, the bank layer BL may include a first partition wall PT1 and a second partition wall PT2 that is formed integrally with the first partition wall PT1 and is a remaining portion except for the first partition wall PT1. The first partition wall PT1 may be located in at least one second opening OP2 of the bank layer BL.

According to some embodiments, in the case of the second opening OP2 in which the first partition wall PT1 is positioned, the second opening OP2 may be divided into two openings by the first partition wall PT1. However, in the case of the second opening OP2 in which the first partition wall PT1 is not positioned, the second opening OP2 may have a rectangular planar shape.

A spacer may be located on the first partition wall PT1 of the bank layer BL. The spacer may serve to maintain a gap between the color conversion substrate 200 and the array substrate (e.g., the array substrate 100 of FIG. 5). For example, the spacer may include an organic material.

The color conversion layer CCL may be located under the protective layer 190. The color conversion layer CCL may convert light emitted from the light emitting elements (e.g., the first, second, and third light emitting elements EE1, EE2, and EE3 of FIG. 5) into light having a specific wavelength. For example, the color conversion layer CCL may include color conversion particles.

The color conversion layer CCL may include the first color conversion pattern CCP1, the second color conversion pattern CCP2, and the transmitting pattern TP. For example, the first color conversion pattern CCP1 may overlap the first light transmitting area TA1, the second color conversion pattern CCP2 may overlap the second light transmitting area TA2, and the transmitting pattern TP 3 may overlap the light transmitting area TA3.

The first color conversion pattern CCP1 may convert light emitted from the first light emitting element (e.g., the first light emitting element EE1 of FIG. 5) into light of a first color (e.g., red light). The second color conversion pattern CCP2 may convert light emitted from the second light emitting element (e.g., the second light emitting element EE2 of FIG. 5) into light of a second color (e.g., green light). The transmitting pattern TP may transmit light emitted from the third light emitting element (e.g., the third light emitting element EE3 of FIG. 5). According to some embodiments, the light may be blue light. However, the configuration of the present invention is not limited thereto, and the light may mean light of other colors such as white light.

The first color conversion pattern CCP1 may include first color conversion particles excited by the light generated from the first light emitting element and emitting light of a first color. The first color conversion pattern CCP1 may further include a first photosensitive polymer in which first scattering particles are dispersed.

The second color conversion pattern CCP2 may include second color conversion particles excited by the light generated from the second light emitting element and emitting light of a second color. The second color conversion pattern CCP2 may further include a second photosensitive polymer in which second scattering particles are dispersed. Each of the first color conversion particle and the second color conversion particle may denote a quantum dot.

The transmitting pattern TP may transmit light generated from the third light emitting element and emit the light toward the second substrate 170. The transmitting pattern TP may include a third photosensitive polymer in which third scattering particles are dispersed. For example, each of the first to third photosensitive polymers may include a light-transmitting organic material such as a silicone resin, an epoxy resin, and the like. These may be used alone or in combination with each other.

The first, second, and third photosensitive polymers may include the same material as each other. The first, second, and third scattering particles may scatter and emit light generated from the first, second, and third light emitting elements, and the first, second, and third scattering particles may include the same material as each other.

Figure 10:
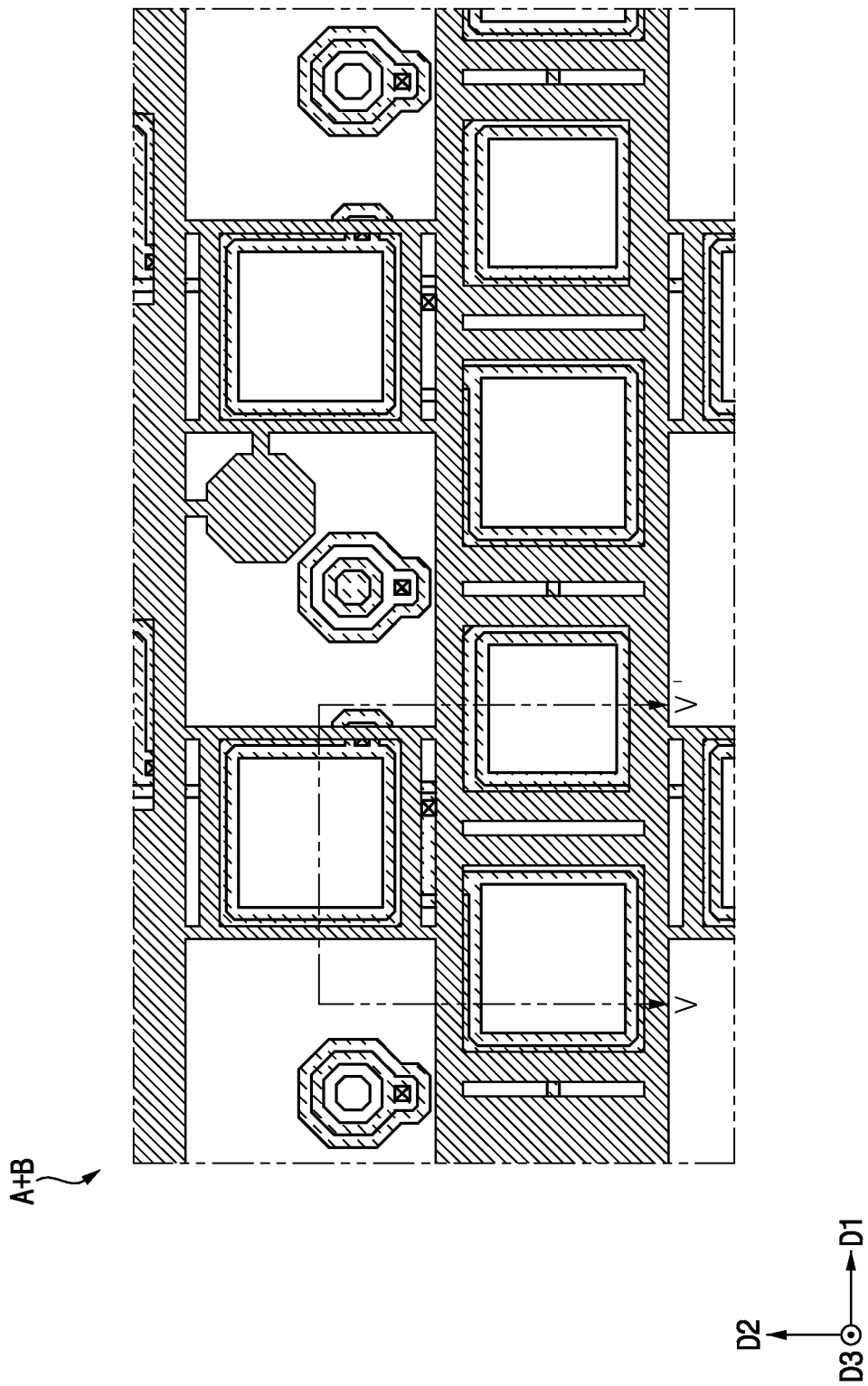
FIG. 10 is a plan view illustrating the area A of FIG. 4 and the area B of FIG. 8 together according to some embodiments.
Figure 11:
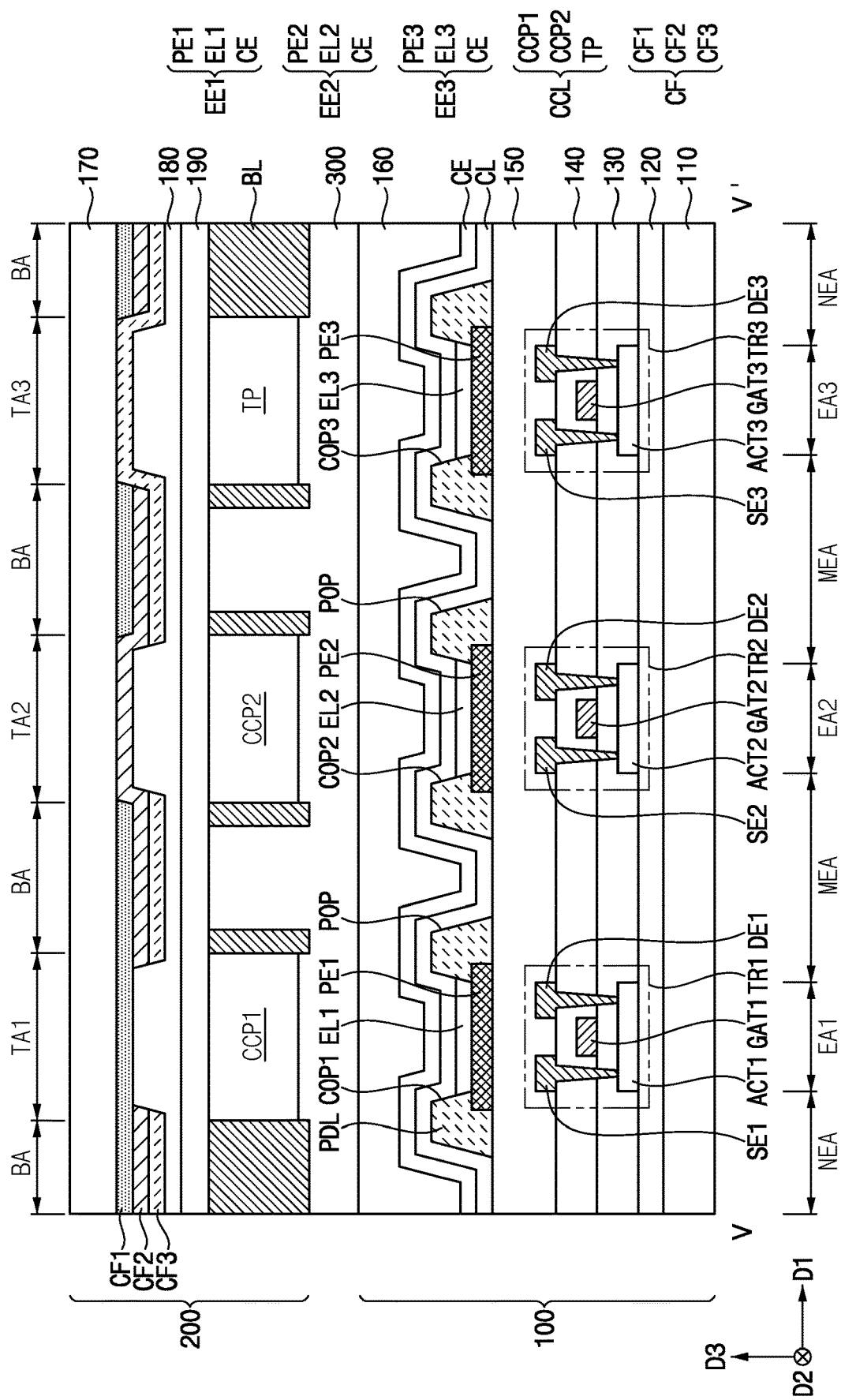
FIG. 11 is a cross-sectional view taken along the line V-V of FIG. 10 according to some embodiments.

FIG. 10 is a plan view illustrating area A of FIG. 4 and area B of FIG. 8 together. FIG. 11 is a cross-sectional view taken along line V-V of FIG. 10.

Referring to FIGS. 4, 5, 8, 9, 10, and 11, the display device 1000 according to some embodiments of the present invention may include the array substrate 100, the filling layer 300, and the color conversion substrate 200.

Here, the array substrate 100 may include the first substrate 110, the buffer layer 120, the gate insulating layer 130, the first, second, and third transistors TR1, TR2, and TR3, the interlayer insulating layer 140, the conductive pattern 145, the planarization layer 150, the pixel defining layer PDL, the insulating pattern IP, the first, second, and third light emitting elements 200a, 200b, and 200c, the common layer CL, and the encapsulation layer 160. The color conversion substrate 200 may include the second substrate 170, the color filter layer CF, the low refractive index layer 180, the protective layer 190, the color conversion layer CCL, and the bank layer BL.

The array substrate 100 and the color conversion substrate 200 may be coupled to each other. For example, the filling layer 300 may be located on the array substrate 100 and the color conversion substrate 200 may be located on the filling layer 300.

As described above, the array substrate 100 may include the first light emitting area EA1, the second light emitting area EA2, the third light emitting area EA3, and the non-light emitting area NEA, and the color conversion substrate 200 may include a first light-transmitting area TA1, a second light transmitting area TA2, a third light transmitting area TA3, and a light-blocking area BA.

The first light emitting area EA1 may overlap (or corresponds to) the first light transmitting TA1, the second light emitting area EA2 may overlap (or corresponds to) the second light transmitting area TA2, and the third light emitting area EA2 may overlap (or corresponds to) the second light transmitting area TA2. The light emitting area EA3 may overlap (or correspond to) the third light transmitting area TA3. In addition, the non-light emitting area NEA may overlap the light blocking area BA, and the light blocking area BA may overlap the contact area CA.

According to some embodiments, the area of the first light transmitting area TA1 may be larger than the area of the first light emitting area EA1, the area of the second light transmitting area TA2 may be larger than the area of the second light emitting area EA2, and the area of the third light transmitting area TA3 may be larger than the area of the third light emitting area EA3. According to some embodiments, the area of the first light transmitting area TA1 may be the same as the area of the first light emitting area EA1, the area of the second light transmitting area TA2 may be the same as the area of the second light emitting area EA2, and the area of the third light transmitting area TA3 may be the same as the area of the third light emitting area EA3.

The second opening OP2 may overlap the contact area CA. According to some embodiments, an entire portion of the insulating pattern IP positioned adjacent to the contact area CA may overlap the second opening OP2 of the bank layer BL. That is, the insulating pattern IP may be spaced apart from the bank layer BL in a plan view.

The third opening OP3 of the bank layer BL may partially overlap the pixel defining layer PDL. For example, the third opening OP3 may partially overlap the first connection portion CP1 of the pixel defining layer PDL. In addition, the fourth opening OP4 of the bank layer BL may partially overlap the pixel defining layer PDL. For example, the fourth opening OP4 may partially overlap the second connection portion CP2 of the pixel defining layer PDL.

However, although the display device 1000 of the present invention is limited to an organic light emitting display device ("OLED"), the configuration of the present invention is not limited thereto. In other embodiments, the display device 1000 may include a liquid crystal display device ("LCD"), a field emission display device ("FED"), a plasma display device ("PDP"), an electrophoretic display device ("EPD") or an inorganic light emitting display device ("ILED").

As described above, the display device 1000 according to some embodiments of the present invention may have a combined structure (i.e., a structure including two substrates) in which the color conversion substrate 200 including the color conversion layer CCL and the array substrate 100 including the light emitting elements EE1, EE2, and EE3 are combined. However, embodiments according to the present invention are not limited thereto, and the display device 1000 may have a stacked structure (i.e., a single substrate structure) in which the array substrate 100 including light emitting elements EE1, EE2, and EE3 and the color conversion layer CCL on the array substrate 100 sequentially stacked on the array substrate 100.

In a pixel defining layer in which a central opening exposing a portion of an upper surface of a pixel electrode is defined and continuously extending in an area excluding the central opening, a thickness of an encapsulation layer overlapping the pixel defining layer may be smaller than a thickness of the encapsulation layer overlapping a light emitting layer. In this case, when a foreign material penetrates the pixel defining layer, a defect in a display device may occur.

In addition, in the process of forming a color conversion layer, a foreign material (e.g., ink and the like) may drip onto the bank layer. In this case, a gap defect may occur between an array substrate included in the display device and a color conversion substrate.

The display device 1000 according to some embodiments of the present invention may include the array substrate 100 and the color conversion substrate 200 located on the array substrate 100. The array substrate 100 may include the pixel defining layer PDL in which the peripheral opening POP partially overlapping the non-light emitting area NEA is defined. The color conversion substrate 200 may include the bank layer BL in which the second opening OP2 overlapping the light blocking area BA is defined and having a polygonal planar shape. Accordingly, defects of the display device 1000 due to penetration of a foreign material may be improved.

FIGS. 12, 13, 14, and 15 are cross-sectional views illustrating a method of manufacturing the array substrate of FIG. 5.

Figure 12:
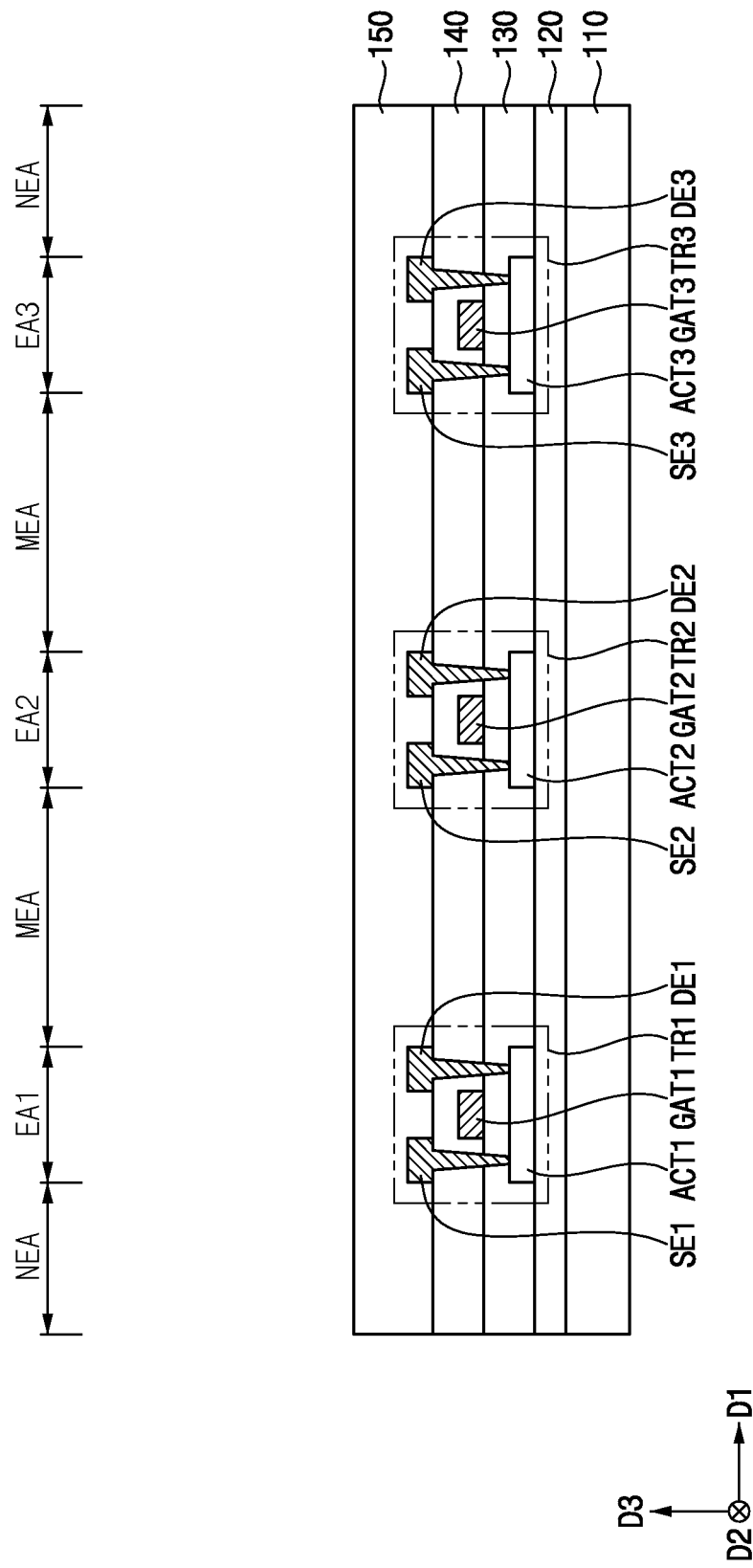
FIGS. 12, 13, 14, and 15 are cross-sectional views illustrating a method of manufacturing the array substrate of FIG. 5 according to some embodiments.

Referring to FIG. 12, the buffer layer 120 may be formed on the substrate 110 including a transparent material or an opaque material. For example, the buffer layer 120 may be formed using an inorganic material such as silicon oxide, silicon nitride, silicon oxynitride, and the like.

The first, second, and third active layers ACT1, ACT2, and ACT3 may be formed on the buffer layer 120. Each of the first, second, and third active layers ACT1, ACT2, and ACT3 may include a metal oxide semiconductor, an inorganic semiconductor, or an organic semiconductor. The first, second, and third active layers ACT1, ACT2, and ACT3 may be simultaneously or concurrently formed using the same material. For example, each of the first, second, and third active layers ACT1, ACT2, and ACT3 may include a source region, a drain region, and a channel region positioned between the source region and the drain region.

The gate insulating layer 130 may be formed on the buffer layer 120. The gate insulating layer 130 may cover the first to third active layers ACT1, ACT2, and ACT3. For example, the gate insulating layer 130 may be formed using an inorganic material such as silicon oxide, silicon nitride, and the like.

The first, second, and third gate electrodes GAT1, GAT2, and GAT3 may be formed on the gate insulating layer 130. Each of the first, second, and third gate electrodes GAT1, GAT2, and GAT3 may be formed to overlap the channel region of each of the first, second, and third active layers ACT1, ACT2, and ACT3. For example, each of the first, second, and third gate electrodes GAT1, GAT2, and GAT3 may be formed of a metal, an alloy, a metal nitride, a conductive metal oxide, a transparent conductive material, and the like. The first, second, and third gate electrodes GAT1, GAT2, and GAT3 may be simultaneously or concurrently formed using the same material.

The interlayer insulating layer 140 may be formed on the gate insulating layer 130. The interlayer insulating layer 140 may cover the first to third gate electrodes GAT1, GAT2, and GAT3. For example, the interlayer insulating layer 140 may be formed using an inorganic material such as silicon oxide, silicon nitride, and the like.

The first, second, and third source electrodes SE1, SE2, and SE3 may be formed on the interlayer insulating layer 140. Each of the first, second, and third source electrodes may be connected to the source region of each of the first, second, and third active layers ACT1, ACT2, and ACT3 through a contact hole formed by removing portions of the gate insulating layer 130 and the interlayer insulating layer 140. In addition, the first, second, and third drain electrodes DE1, DE2, and DE3 may be formed on the interlayer insulating layer 140. Each of the first, second, and third drain electrodes DE1, DE2, and DE3 may be connected to the drain region of each of the first, second, and third active layers ACT1, ACT2, and ACT3 through a contact hole formed by removing portions of the gate insulating layer 130 and the interlayer insulating layer 140.

Each of the first, second, and third source electrodes SE1, SE2, and SE3 and the first, second, and third drain electrodes DE1, DE2, and DE3 may include a metal, an alloy, a metal nitride, a conductive metal oxide, a transparent conductive material, and the like. The first, second, and third source electrodes SE1, SE2, and SE3 and the first, second, and third drain electrodes DE1, DE2, and DE3 may be simultaneously or concurrently formed using the same material.

The planarization layer 150 may be formed on the interlayer insulating layer 140. The planarization layer 150 may be formed to sufficiently cover the first, second, and first source electrodes SE1, SE2, and SE3 and the first, second, and third drain electrodes DE1, DE2, and DE3. For example, the planarization layer 150 may be formed using an organic material such as a phenol resin, a polyimide resin, a polyamide resin, and the like.

Figure 13:
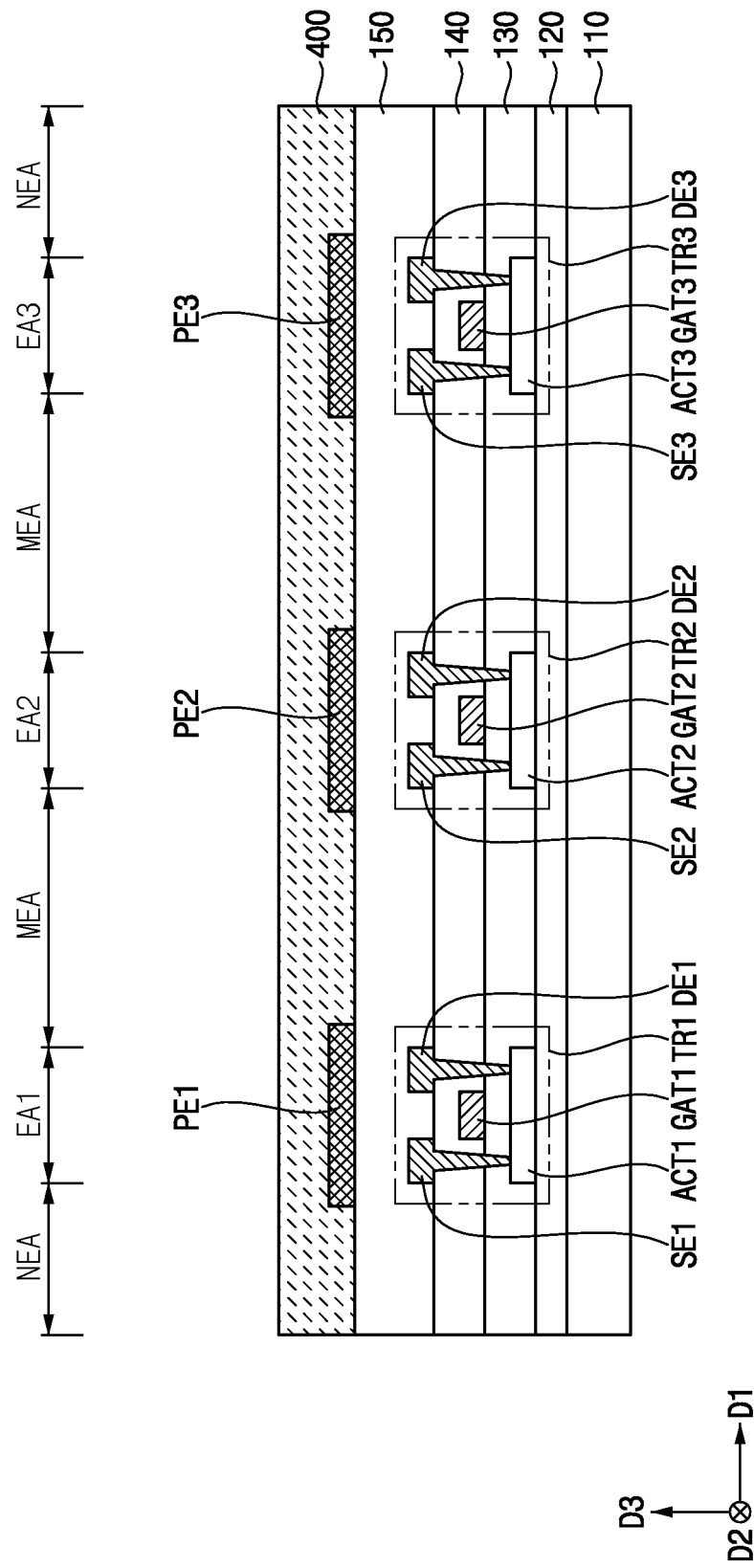

Referring to FIG. 13, the first, second, and third pixel electrodes PE1, PE2, and PE3 may be formed on the planarization layer 150. Each of the first, second, and third pixel electrodes PE1, PE2, and PE3 may be formed in each of the first, second, and third light emitting areas EA1, EA2, and EA3. The first, second, and third pixel electrodes PE1, PE2, and PE3 may be simultaneously or concurrently formed using the same material.

The insulating layer 400 may be formed on the planarization layer 150. The insulating layer 400 may be entirely formed in the first, second, and third light emitting areas EA1, EA2, and EA3 and the non-emitting area NEA. For example, the insulating layer 400 may be formed using an organic material. Alternatively, the insulating film 400 may be formed using an organic material including a light blocking material such as black pigment, black dye, and the like.

Figure 14:
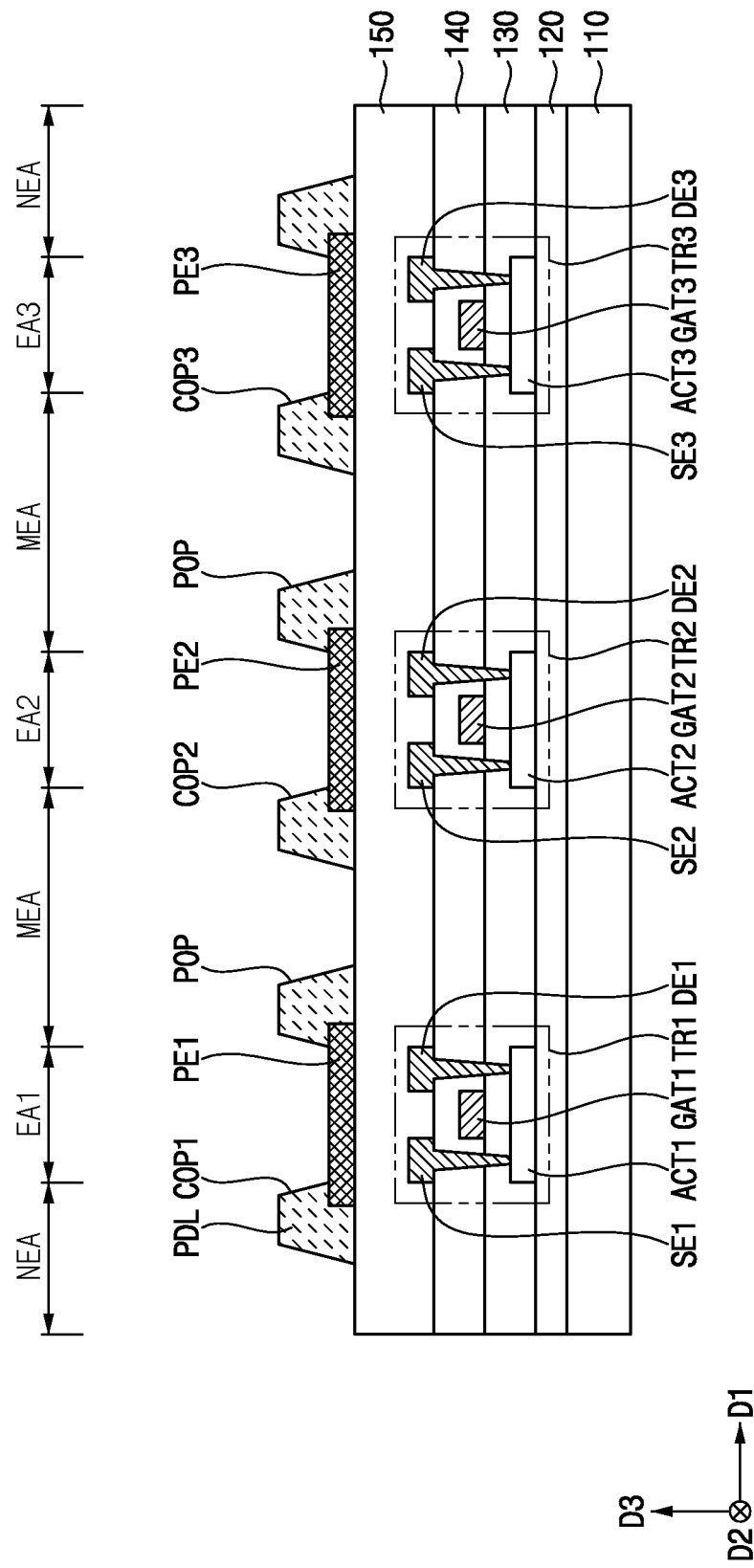

Referring to FIG. 14, an etching process may be performed on the insulating layer 400 to form a pixel defining layer PDL overlapping the non-light emitting area NEA. Here, through the etching process, the first central opening COP1 exposing a portion of the upper surface of the first pixel electrode PE1, the second central opening COP2 exposing a portion of the upper surface of the second pixel electrode PE2, and the third central opening COP3 exposing a portion of the upper surface of the third pixel electrode PE3 may formed in the pixel defining layer PDL. In addition, through the etching process, the peripheral opening POP exposing the upper surface of the planarization layer 150 may be formed in the pixel defining layer PDL in the non-light emitting area NEA.

Figure 15:
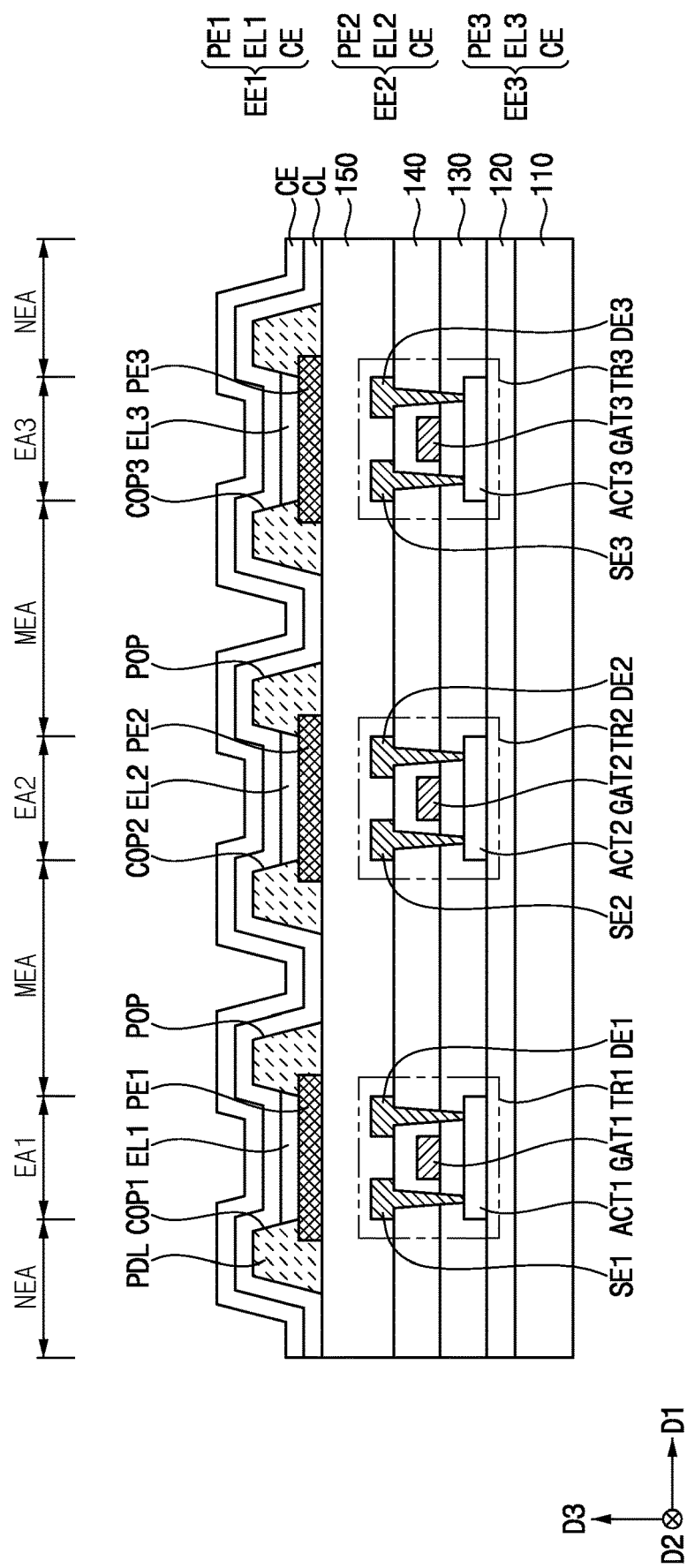

Referring to FIG. 15, the first light emitting layer EL1 may be formed on the first pixel electrode PE1, the second light emitting layer EL2 may be formed on the second pixel electrode PE2, and the third light emitting layer EL3 may be formed on the third pixel electrode PE3. For example, each of the first, second, and third light emitting layers EL1, EL2, and EL3 may be formed using a low-molecular organic compound or a high-molecular organic compound.

The common layer CL may be formed on the planarization layer 150, the pixel defining layer PDL, the first light emitting layer EL1, the second light emitting layer EL2, and the third light emitting layer EL3. The common layer CL may continuously extend in the first, second, and third light emitting areas EA1, EA2, and EA3 and in the non-light emitting area NEA. For example, the common layer CL may include a hole injection layer, a hole transport layer, an electron transport layer, an electron injection layer, and the like.

The common electrode CE may be formed on the common layer CL. The common electrode CE may continuously extend in the first, second, and third light emitting areas EA1, EA2, and EA3 and in the non-light emitting area NEA. For example, the common electrode CE may be formed using a metal, an alloy, a metal nitride, a conductive metal oxide, a transparent conductive material, and the like.

Referring back to FIG. 5, the encapsulation layer 160 may be formed on the common electrode CE. The encapsulation layer 160 may continuously extend in the first, second, and third light emitting areas EA1, EA2, and EA3 and in the non-light emitting area NEA. For example, the encapsulation layer 160 may include at least one inorganic encapsulation layer and at least one organic encapsulation layer.

Accordingly, the array substrate 100 illustrated in FIG. 5 may be manufactured.

FIGS. 16, 17, 18, and 19 are cross-sectional views illustrating a method of manufacturing the color conversion substrate of FIG. 9.

Figure 16:
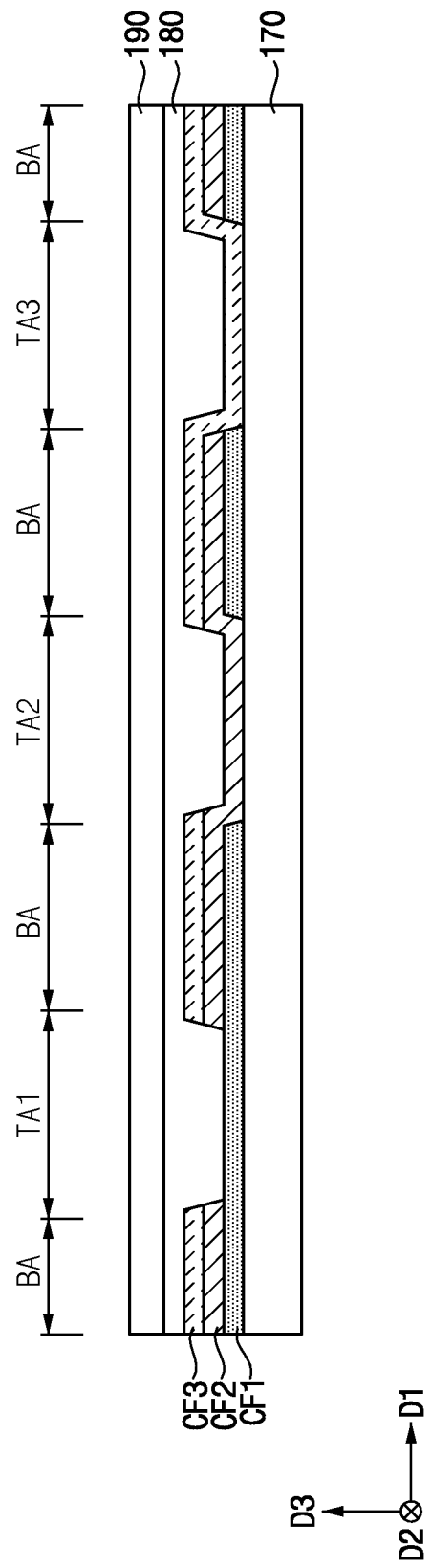
FIGS. 16, 17, 18, and 19 are cross-sectional views illustrating a method of manufacturing the color conversion substrate of FIG. 9 according to some embodiments.

Referring to FIG. 16, the first color filter layer CF1 may be formed on a second substrate 170 made of a transparent resin substrate. The first color filter layer CF1 may overlap the first light transmitting area TA1 and the light blocking area BA. The first color filter layer CF1 may be a red color filter that transmits red light. For example, the first color filter layer CF1 may be formed from a red pigment and/or a color filter composition including a red pigment.

The second color filter layer CF2 may be formed on the first color filter layer CF1 and the second substrate 170. The second color filter layer CF2 may overlap the second light transmitting area TA2 and the light blocking area BA. The second color filter layer CF2 may be a green color filter that transmits green light. For example, the second color filter layer CF2 may be formed from a green pigment and/or a color filter composition including the green pigment.

The third color filter layer CF3 may be formed on the second color filter layer CF2 and the second substrate 170. The third color filter layer CF3 may overlap the third light transmitting area TA3 and the light blocking area BA. The third color filter layer CF3 may be formed from a blue pigment and/or a color filter composition including the blue pigment.

The low refractive index layer 180 may be formed on the color filter layer CF. The low refractive index layer 180 may cover the color filter layer CF. The low refractive index layer 180 may have a relatively low refractive index. For example, the low refractive index layer 180 may be formed using an organic material.

The protective layer 190 may be formed on the low refractive index layer 180. The protective layer 190 may be formed using an inorganic material. For example, the protective layer 190 may be formed using silicon oxide, silicon nitride, aluminum nitride, and the like.

Figure 17:
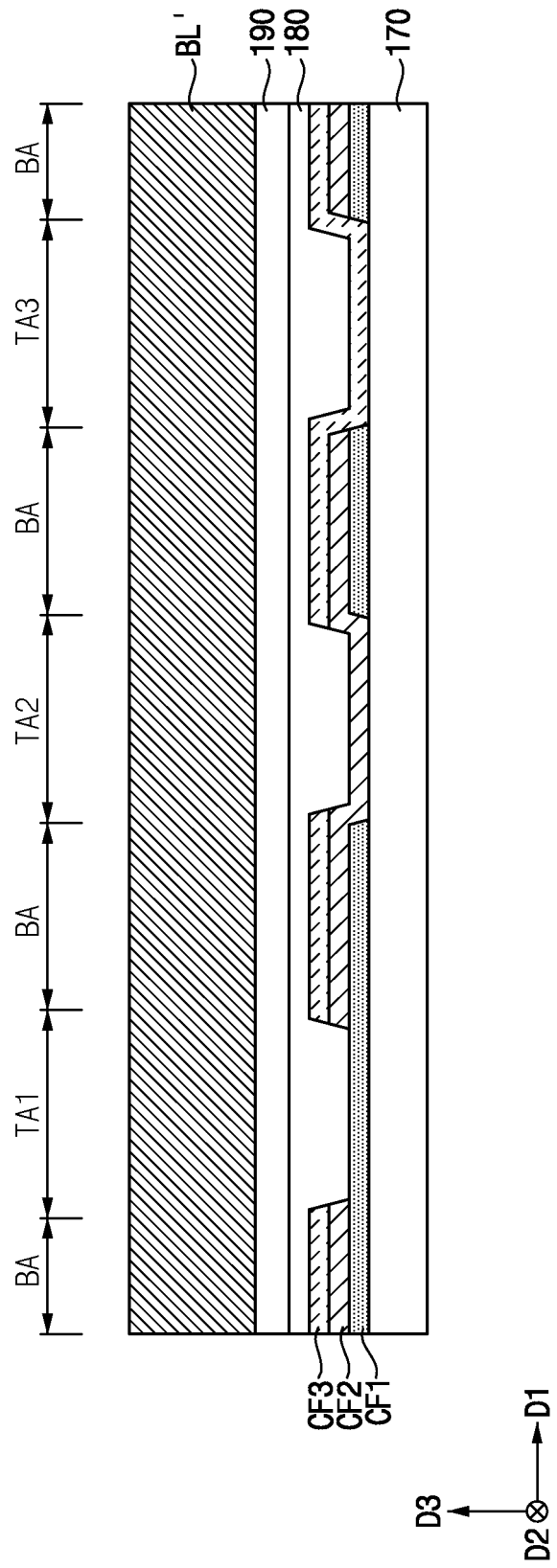

Referring to FIG. 17, a preliminary bank layer BL' may be formed on the protective layer 190. That is, the material forming the preliminary bank layer BL' may be entirely coated on the protective layer 190. For example, the preliminary bank layer BL' may be formed using an organic material such as polyimide.

Figure 18:
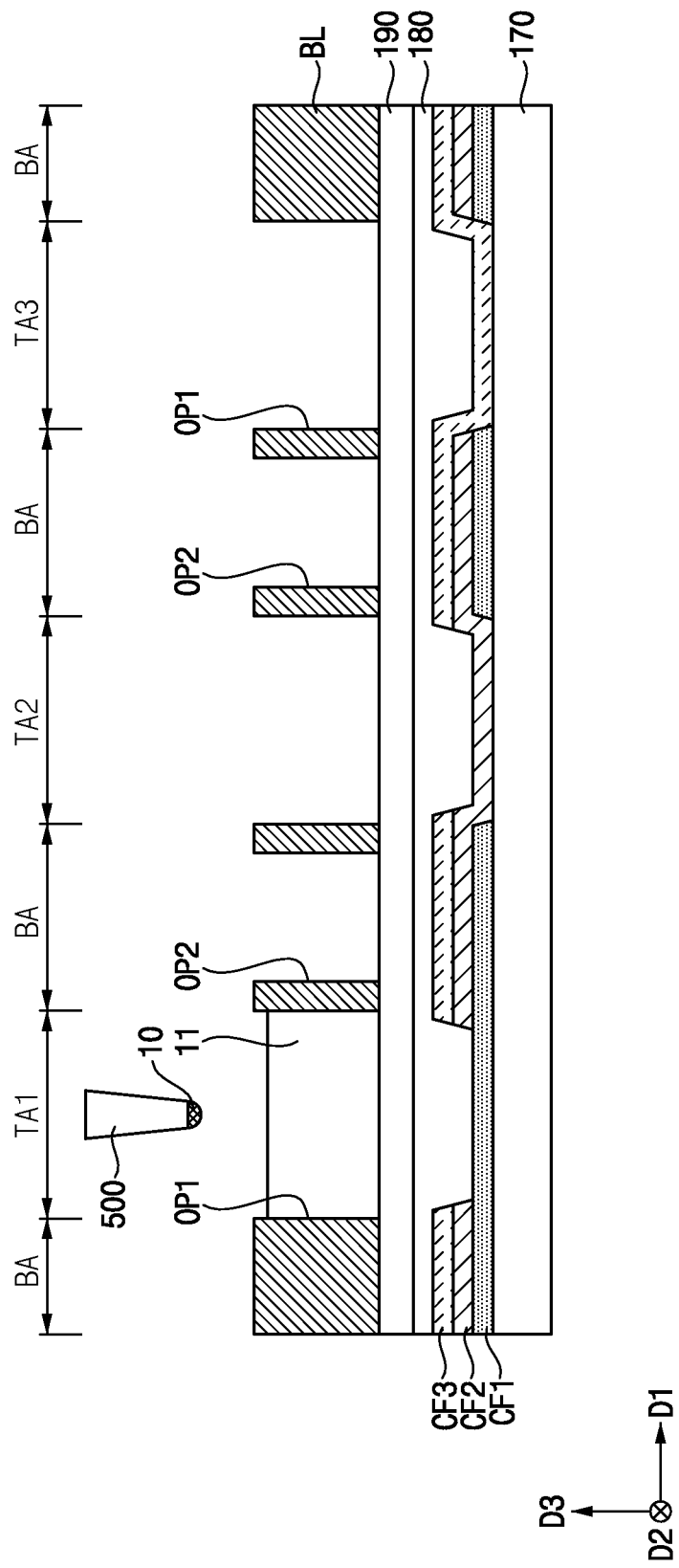

Referring to FIG. 18, the bank layer BL may be formed by performing an etching process on the preliminary bank layer BL'. Here, through the etching process, the first opening OP1 overlapping each of the first, second, and third light transmitting areas TA1, TA2, and TA3 and exposing the upper surface of the protective layer 190 and the second opening OP2 overlapping the light blocking area BA may be formed in the bank layer BL.

An inkjet apparatus 500 may drip an ink 10 into the first opening OP1. Here, the ink 10 may be a material forming a color conversion layer (e.g., the color conversion layer CCL of FIG. 8). In this case, an ink layer 11 used to manufacture the first color conversion pattern CCP1 may be formed in the first opening OP1.

Figure 19:
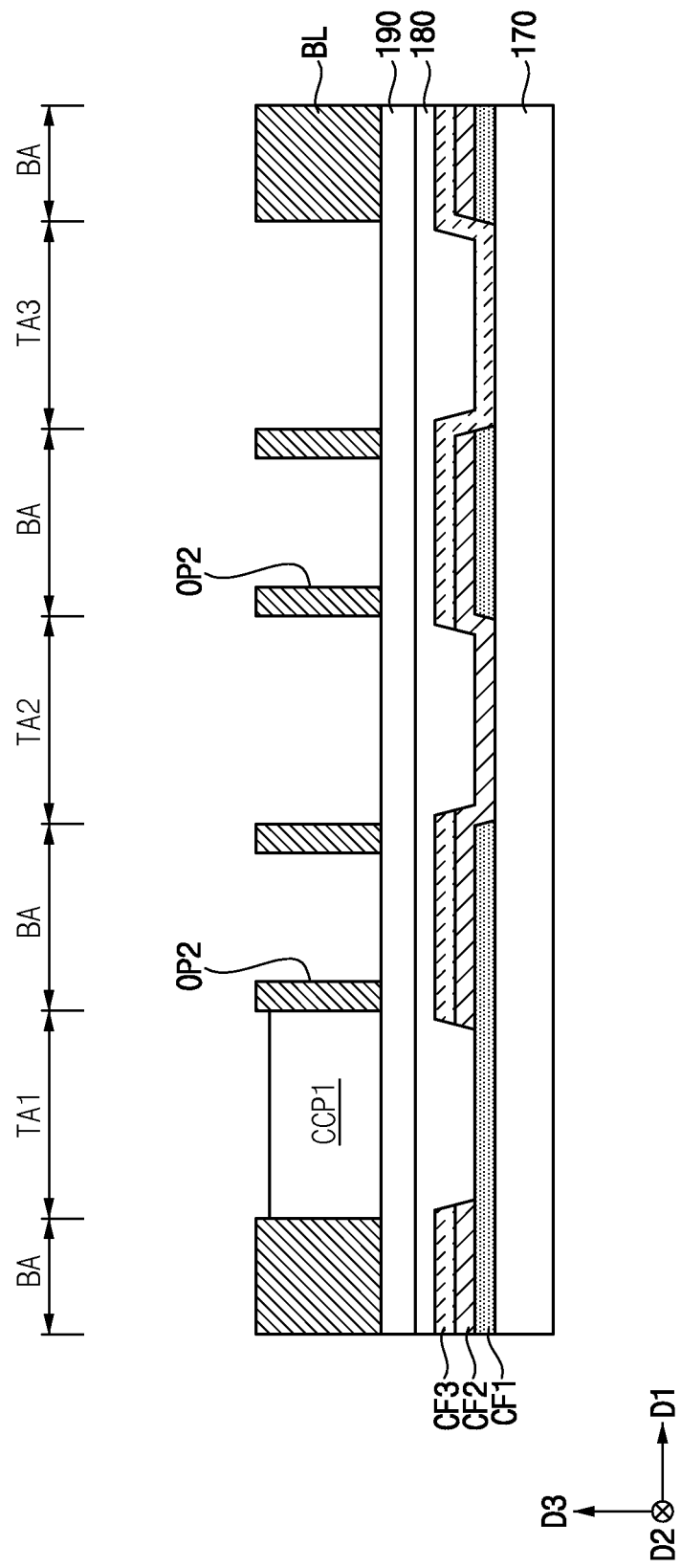

Referring to FIG. 19, the first color conversion pattern CCP1 may be formed by the inkjet apparatus 500 repeatedly dropping the ink 10 onto the first opening OP1 overlapping the first light transmitting area TA1. Referring back to FIG. 9, the second conversion pattern CCP2 and the transmitting pattern TP may be formed by the inkjet apparatus 500 repeatedly dropping the ink 10 into the first opening OP1 overlapping the second and third light transmitting areas TA2 and TA3, respectively.

Accordingly, the color conversion substrate 200 illustrated in FIG. 9 may be manufactured.

Referring again to FIG. 11, the color conversion substrate 200 may be coupled to the array substrate 100 with the filling layer 300 interposed therebetween. Accordingly, the display device 1000 illustrated in FIG. 11 may be manufactured.

Figure 20:
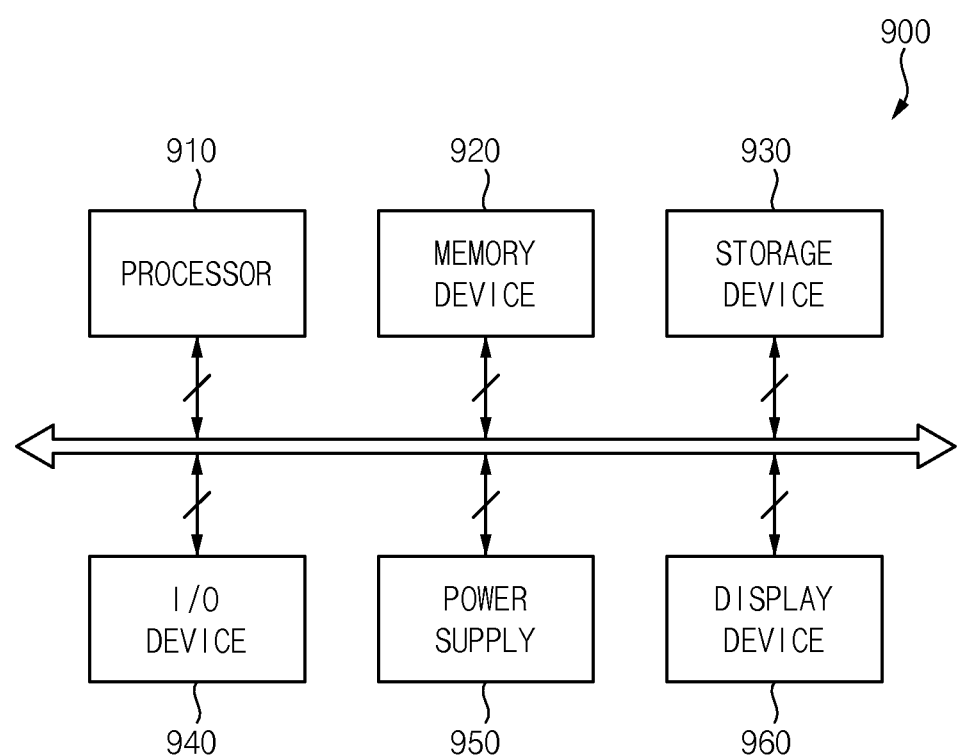
FIG. 20 is a block diagram illustrating an electronic device including the display device of FIG. 1 according to some embodiments.
Figure 21:
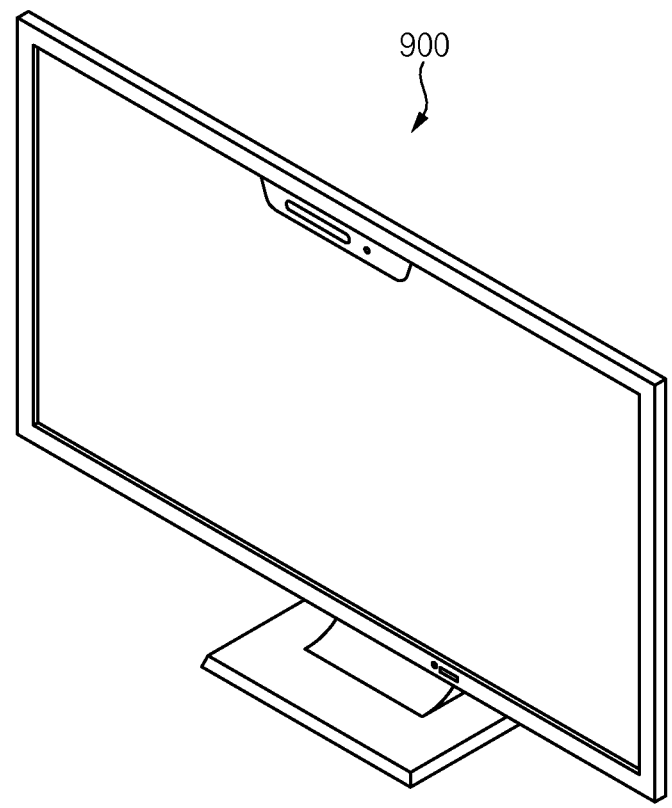
FIG. 21 is a view illustrating an example in which the electronic device of FIG. 20 is implemented as a television according to some embodiments.
Figure 22:
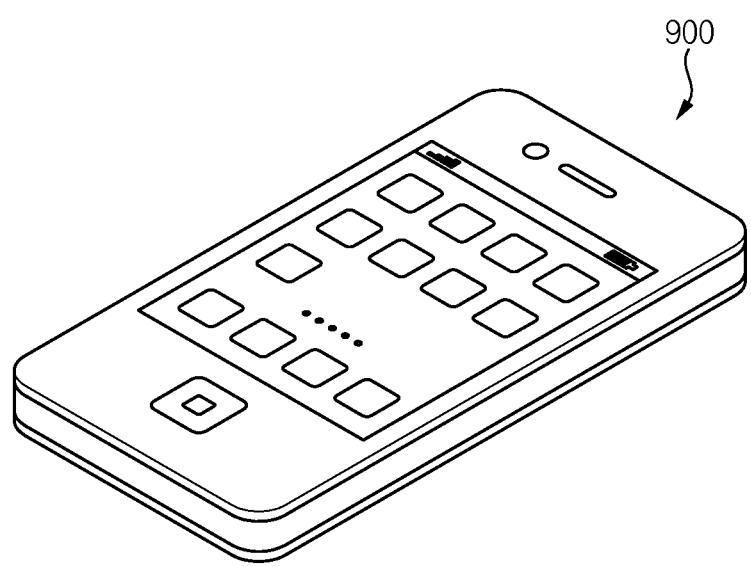
FIG. 22 is a view illustrating an example in which the electronic device of FIG. 20 is implemented as a smart phone according to some embodiments.

FIG. 20 is a block diagram illustrating an electronic device including the display device of FIG. 1. FIG. 21 is a view illustrating an example in which the electronic device of FIG. 20 is implemented as a television. FIG. 22 is a view illustrating an example in which the electronic device of FIG. 20 is implemented as a smart phone.

Referring to FIGS. 20, 21 and 22, according to some embodiments, the electronic device 900 may include a processor 910, a memory device 920, a storage device 930, an input/output ("I/O") device 940, a power supply 950 and a display device 960. In this case, the display device 960 may correspond to the display device 1000 described with reference to FIGS. 1 to 11. The electronic device 900 may further include various ports capable of communicating with a video card, a sound card, a memory card, a USB device, and the like.

According to some embodiments, as illustrated in FIG. 21, the electronic device 900 may be implemented as a television. According to some embodiments, as illustrated in FIG. 22, the electronic device 900 may be implemented as a smart phone. However, embodiments are not limited thereto, according to some embodiments, the electronic device 900 may be implemented as a cellular phone, a video phone, a smart pad, a smart watch, a tablet personal computer ("PC"), a car navigation system, a computer monitor, a laptop, a head located (e.g., mounted) display ("HMD"), or the like.

The processor 910 may perform various computing functions. According to some embodiments, the processor 910 may be a microprocessor, a central processing unit ("CPU"), an application processor ("AP"), or the like. The processor 910 may be coupled to other components via an address bus, a control bus, a data bus, or the like. The processor 910 may be coupled to an extended bus such as a peripheral component interconnection ("PCI") bus.

The memory device 920 may store data for operations of the electronic device 900. According to some embodiments, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a CD-ROM device, or the like.

The I/O device 940 may include an input device such as a keyboard, a keypad, a mouse device, a touchpad, a touch-screen, or the like, and an output device such as a printer, a speaker, or the like.

The power supply 950 may provide power for operations of the electronic device 900. The display device 960 may be coupled to other components via the buses or other communication links. According to some embodiments, the display device 960 may be included in the I/O device 940.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and characteristics of embodiments of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A display device comprising:
   a first substrate including first, second, and third light emitting areas and a non-light emitting area surrounding the first, second, and third light emitting areas;
   first, second, and third pixel electrodes respectively in the first, second, and third light emitting areas on the first substrate;
   a pixel defining layer in the non-light emitting area on the first substrate and defining a peripheral opening partially overlapping the non-light emitting area;
   a second substrate including first, second, and third light transmitting areas and a light blocking area surrounding the first, second, and third light transmitting areas;
   a bank layer in the light blocking area on one surface of the second substrate facing the pixel defining layer, defining a first opening overlapping each of the first, second, and third light transmitting areas, and defining second openings overlapping the light blocking area wherein each of the second openings has a polygonal planar shape; and
   a color conversion layer in the first opening and including color conversion particles.

2. The display device of claim 1, further comprising:
   a planarization layer between the first substrate and the pixel defining layer, and including an organic material, wherein the peripheral opening exposes a portion of an upper surface of the planarization layer.

3. The display device of claim 1, wherein the pixel defining layer continuously extends along at least two adjacent light emitting areas among the first, second, and third light emitting areas.

4. The display device of claim 1, wherein each of the first, second, and third light emitting areas is repeatedly arranged along a first direction and a second direction crossing the first direction, and
wherein the pixel defining layer includes:
a first pattern portion covering an edge of the first pixel electrode;
a second pattern portion covering an edge of the second pixel electrode;
a third pattern portion covering an edge of the third pixel electrode;
a first connection portion overlapping a portion of the first pixel electrode and connecting the first, second, and third pattern portions; and
second connection portions connecting two adjacent pattern portions among the first, second, and third pattern portions and including a portion extending in the first direction and a portion extending in the second direction.

5. The display device of claim 1, wherein a central opening exposing a portion of an upper surface of each of the first, second, and third pixel electrodes is further defined in the pixel defining layer.

6. The display device of claim 1, wherein the pixel defining layer includes an inorganic material or an organic material.

7. The display device of claim 6, wherein the pixel defining layer includes an organic material containing at least one selected from a group consisting of black pigment, black dye, and carbon black.

8. The display device of claim 1, wherein each of the second openings has a rectangular planar shape.

9. The display device of claim 1, wherein the bank layer includes:
a first partition wall in at least one of the second openings; and
a second partition wall formed integrally with first partition wall and being a remaining portion except for the first partition wall.

10. The display device of claim 9, wherein the second opening in which the first partition wall is located is divided into two openings by the first partition wall.

11. The display device of claim 10, wherein a third opening extending in a first direction and a fourth opening extending in a second direction crossing the first direction is further defined in the bank layer.

12. The display device of claim 11, wherein each of the first, second, and third light emitting areas is repeatedly arranged along a first direction and a second direction crossing the first direction, and
wherein the third opening is positioned adjacent to the first opening overlapping the second light transmitting area, and the fourth opening is positioned between the first openings overlapping the first and third light transmitting areas, respectively.

13. The display device of claim 1, wherein the first light transmitting area overlaps the first light emitting area, the second light transmitting area overlaps the second light emitting area, and the third light transmitting area overlaps the third light emitting area.

14. The display device of claim 13, wherein an area of the first light emitting area is smaller than an area of the first light transmitting area, an area of the second light emitting area is smaller than an area of the second light transmitting area, and an area of the third light emitting area is smaller than an area of the third light transmitting area.

15. The display device of claim 13, wherein the first, second, and third emitting areas emit light of a first color, and
wherein light of a second color different from the first color is transmitted through the first light transmitting area, light of a third color different from the first color and the second color is transmitted through the second light transmitting area, and light of the first color is transmitted through the third light transmitting area.

16. The display device of claim 1, further comprising:
a color filter layer on one surface of the second substrate; and
a protective layer on one surface of the color filter layer facing the bank layer and including an inorganic material.

17. The display device of claim 16, wherein the bank layer is on one surface of the protective layer facing the bank layer, and the second opening exposes an upper surface of the protective layer.

18. The display device of claim 1, further comprising:
a filling layer between the pixel defining layer and the bank layer, and including a light transmitting material,
wherein a portion of the filling layer is filled in the second opening.

19. A display device comprising:
a first substrate including a light emitting area, a contact area adjacent to the light emitting area, and a non-light emitting area surrounding the light emitting area and the contact area;
a pixel electrode in the light emitting area on the first substrate;
a pixel defining layer on the first substrate and defining a central opening exposing a portion of an upper surface of the pixel electrode in the light emitting area and a peripheral opening spaced apart from the pixel electrode in a plan view in the non-light emitting area;
a second substrate including a light transmitting area and a light blocking area surrounding the light transmitting area and overlapping the contact area;
a bank layer on one surface of the second substrate facing the pixel defining layer, defining a first opening overlapping the light transmitting area, and defining second openings overlapping the contact area wherein each of the second openings has a polygonal planar shape; and
a color conversion layer in the first opening and including color conversion particles.

20. The display device of claim 19, wherein a laser drilling process is performed on the contact area.

21. The display device of claim 19, further comprising:
an insulating pattern on the first substrate, adjacent to contact area, and including a same material as the pixel defining layer.

22. The display device of claim 21, wherein the insulating pattern is spaced apart from the pixel defining layer in a plan view.

23. The display device of claim 21, wherein an entire portion of the insulating pattern overlaps the second opening.

24. The display device of claim 21, wherein the insulating pattern is spaced apart from the bank layer in a plan view.

* * * * *